US011687009B2

(12) United States Patent
Bauerschmidt et al.

(10) Patent No.: US 11,687,009 B2
(45) Date of Patent: Jun. 27, 2023

(54) MODE CONTROL OF PHOTONIC CRYSTAL FIBER BASED BROADBAND RADIATION SOURCES

(71) Applicants: ASML NETHERLANDS B.V., Veldhoven (NL); ASML HOLDING N.V., Veldhoven (NL)

(72) Inventors: Sebastian Thomas Bauerschmidt, Wendelstein (DE); Peter Maximilian Götz, Altdorf (DE); Patrick Sebastian Uebel, Marloffstein (DE); Ronald Franciscus Herman Hugers, Best (NL); Jan Adrianus Boer, Eindhoven (NL); Edwin Johannes Cornelis Bos, Dommelen (NL); Andreas Johannes Antonius Brouns, Eindhoven (NL); Vitaliy Prosyentsov, Helmond (NL); Paul William Scholtes-Van Eijk, Veldhoven (NL); Paulus Antonius Andreas Teunissen, Eindhoven (NL); Mahesh Upendra Ajgaonkar, Guildford, CT (US)

(73) Assignees: ASML NETHERLANDS B.V., Veldbeven (NL); ASML HOLDING N.V., Veldhoven (NL)

( * ) Notice: Subject to any disclaimer, the term of this patent is extended or adjusted under 35 U.S.C. 154(b) by 0 days.

(21) Appl. No.: 17/741,545

(22) Filed: May 11, 2022

(65) Prior Publication Data

US 2022/0269183 A1    Aug. 25, 2022

Related U.S. Application Data

(63) Continuation of application No. 17/004,140, filed on Aug. 27, 2020, now Pat. No. 11,360,396.

(30) Foreign Application Priority Data

Sep. 2, 2019   (EP) ..................... 19194974
Dec. 11, 2019  (EP) ..................... 19215183
(Continued)

(51) Int. Cl.
    *G03F 7/20*     (2006.01)
    *G03F 7/00*     (2006.01)
    (Continued)

(52) U.S. Cl.
    CPC .......... *G03F 7/70625* (2013.01); *G01B 11/27* (2013.01); *G01J 1/4257* (2013.01);
    (Continued)

(58) Field of Classification Search
    CPC ............. G03F 7/70525; G03F 7/70616; G03F 7/70625; G03F 7/7065; G02B 1/005;
    (Continued)

(56) References Cited

U.S. PATENT DOCUMENTS 6,952,253 B2   10/2005   Lof et al.
6,961,116 B2   11/2005   Den Boef et al.
(Continued)

FOREIGN PATENT DOCUMENTS

CN   203720405   7/2014
CN   206096546   4/2017
(Continued)

OTHER PUBLICATIONS

Extended European Search Report issued in corresponding European patent Application No. 19194974.2, dated Mar. 4, 2020.
(Continued)

*Primary Examiner* — Peter B Kim
(74) *Attorney, Agent, or Firm* — Pillsbury Winthrop Shaw Pittman, LLP

(57) ABSTRACT

A mode control system and method for controlling an output mode of a broadband radiation source including a photonic
(Continued)

crystal fiber (PCF). The mode control system includes at least one detection unit configured to measure one or more parameters of radiation emitted from the broadband radiation source to generate measurement data, and a processing unit configured to evaluate mode purity of the radiation emitted from the broadband radiation source, from the measurement data. Based on the evaluation, the mode control system is configured to generate a control signal for optimization of one or more pump coupling conditions of the broadband radiation source. The one or more pump coupling conditions relate to the coupling of a pump laser beam with respect to a fiber core of the photonic crystal fiber.

20 Claims, 10 Drawing Sheets

(30) Foreign Application Priority Data

Jan. 20, 2020 (EP) .................................. 20152635
Mar. 26, 2020 (EP) .................................. 20165824

(51) Int. Cl.
*G02B 1/00* (2006.01)
*G02B 6/02* (2006.01)
*G01B 11/27* (2006.01)
*G01J 1/42* (2006.01)
*G01M 11/00* (2006.01)

(52) U.S. Cl.
CPC ............. *G01M 11/30* (2013.01); *G02B 1/005* (2013.01); *G02B 6/02* (2013.01); *G03F 7/7065* (2013.01); *G03F 7/70525* (2013.01)

(58) Field of Classification Search
CPC .... G02B 6/02; G02B 6/02309; G02B 6/4225; G02F 1/365; G02F 2202/32; G01B 11/27; G01J 1/0425; G01J 1/4257; G01J 2001/4247; G01M 11/30; G01M 11/33; G01M 11/35; H01S 3/0092
See application file for complete search history.

(56) References Cited

U.S. PATENT DOCUMENTS

| | | | |
|---|---|---|---|
| 7,265,364 B2 | 9/2007 | Teunissen et al. | |
| 7,646,471 B2 | 1/2010 | Teunissen et al. | |
| 8,982,918 B2 | 3/2015 | Pedersen | |
| 9,160,137 B1 | 10/2015 | Abdolvand et al. | |
| 10,630,043 B1 | 4/2020 | Vorontsov | |
| 2002/0122173 A1* | 9/2002 | Bruns | G02B 6/4225 356/153 |
| 2004/0175085 A1 | 9/2004 | Forbes et al. | |
| 2007/0296960 A1 | 12/2007 | Den Boef et al. | |
| 2008/0198380 A1 | 8/2008 | Straaijer et al. | |
| 2009/0168062 A1 | 7/2009 | Straaijer et al. | |
| 2010/0007863 A1 | 1/2010 | Jordanoska | |
| 2010/0233600 A1 | 9/2010 | Den Boef et al. | |
| 2010/0328655 A1 | 12/2010 | Den Boef | |
| 2011/0026032 A1 | 2/2011 | Den Boef et al. | |
| 2011/0032500 A1 | 2/2011 | Straaijer | |
| 2011/0102753 A1 | 5/2011 | Van De Kerkhof et al. | |
| 2011/0102793 A1 | 5/2011 | Straaijer | |
| 2011/0188020 A1 | 8/2011 | Den Boef | |
| 2011/0239438 A1* | 10/2011 | Ogawa | G02B 6/4227 385/52 |
| 2011/0249244 A1 | 10/2011 | Leewis et al. | |
| 2012/0044470 A1 | 2/2012 | Smilde et al. | |
| 2012/0044495 A1 | 2/2012 | Straaijer | |
| 2013/0162996 A1 | 6/2013 | Straaijer et al. | |
| 2013/0308142 A1 | 11/2013 | Straaijer | |
| 2013/0343748 A1 | 12/2013 | Benou et al. | |
| 2015/0261097 A1 | 9/2015 | Mathijssen et al. | |
| 2015/0292938 A1 | 10/2015 | Guimond | |
| 2016/0161863 A1 | 6/2016 | Den Boef | |
| 2016/0363728 A1 | 12/2016 | Wang et al. | |
| 2016/0370717 A1 | 12/2016 | Den Boef et al. | |
| 2019/0017887 A1 | 1/2019 | Bovero | |
| 2019/0319420 A1* | 10/2019 | Uebel | G02F 1/355 |

FOREIGN PATENT DOCUMENTS

| | | |
|---|---|---|
| EP | 1628164 | 2/2006 |
| EP | 3136143 | 3/2017 |
| JP | 2013057854 | 3/2013 |
| WO | 03030409 | 4/2003 |
| WO | 2016102127 | 6/2016 |
| WO | 2018127266 | 7/2018 |

OTHER PUBLICATIONS

Wang, Chun-can, et al.: "Photonic crystal fiber for fundamental mode operation of multicore fiber lasers and amplifiers", Optics Communications, vol. 281, No. 21, Nov. 1, 2008.
Translation of JP2013057854, Mar. 2017.
Extended European Search Report issued in corresponding European Patent Application No. 20191997.4, dated Sep. 25, 2020.
Zeisberger M., et al.: Analytical model for the complex effective index of the leaky modes of tube-type anti-resonant hollow core fibers, Scientific Reports 7, 11761 (2017) (www.nature.com/articles/s41598-107-12234-5—accessed May 11, 2022).
"Losses in Fiber Optics" (www.slideshare.net/samruddhaparkar1/losses-in-optical-fiber—accessed on May 11, 2022) (2013).
Elg, D., et al.: "Magnetic debris mitigation system for extreme ultraviolet sources," Journal of Micro/Nanolithography, MEMS, and MOEMS 14(1), 013506 (Feb. 9, 2015).
International Search Report and Written Opinion issued in corresponding PCT Patent Application No. PCT/EP2020/073422, dated Sep. 28, 2020.

* cited by examiner

MODE CONTROL OF PHOTONIC CRYSTAL FIBER BASED BROADBAND RADIATION SOURCES

This application is a continuation of U.S. patent application Ser. No. 17/004,140, filed Aug. 27, 2020, now allowed, which is based upon and claims the benefit of priority of European patent application no. 19194974.2, filed Sep. 2, 2019, of European patent application no. 19215183.5, filed Dec. 11, 2019, of European patent application no. 20152635.7, filed Jan. 20, 2020, and of European patent application no. 20165824.2, filed Mar. 26, 2020, each of the foregoing applications is incorporated herein in its entirety by reference.

FIELD

The present description relates to mode control of photonic crystal fiber based broadband radiation generator, and in particular such a broadband radiation generator in relation to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

SUMMARY

Metrology tools are used in many aspects of the IC manufacturing process, for example as alignment tools for proper positioning of a substrate prior to an exposure, leveling tools to measure a surface topology of the substrate, for e.g., focus control and scatterometry based tools for inspecting/measuring the exposed and/or etched product in process control. In each case, a radiation (e.g., electromagnetic light) source is often required. For various reasons, including measurement robustness and accuracy, broadband or white light radiation sources are increasingly used for such metrology applications. It would be desirable to improve on present devices for broadband radiation (e.g., white light) generation.

In an aspect, there is provided mode control system, being configured for controlling an output mode of a broadband radiation source comprising a photonic crystal fiber (PCF), the mode control system comprising: at least one detection unit configured to measure one or more parameters of radiation emitted from the broadband radiation source to generate measurement data; and a processing unit configured to evaluate mode purity of the radiation emitted from the broadband radiation source, from the measurement data, wherein based on the evaluation, the mode control system is configured to generate a control signal for optimization of one or more pump coupling conditions of the broadband radiation source, the one or more pump coupling conditions relating to the coupling of a pump laser beam with respect to a fiber core of the photonic crystal fiber.

In an aspect, there is provided a method of mode control of a broadband radiation source comprising a photonic crystal fiber, the method comprising: measuring one or more parameters of radiation emitted from the broadband radiation source to obtain measurement data; evaluating mode purity of the radiation emitted from the broadband radiation source, from the measurement data; and generating a control signal to optimize of one or more pump coupling conditions of the broadband radiation source, the one or more pump coupling conditions relating to the coupling of a pump laser beam with respect to a fiber core of the photonic crystal fiber.

Other aspects comprise a broadband radiation source and metrology device comprising a mode control system as described herein.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
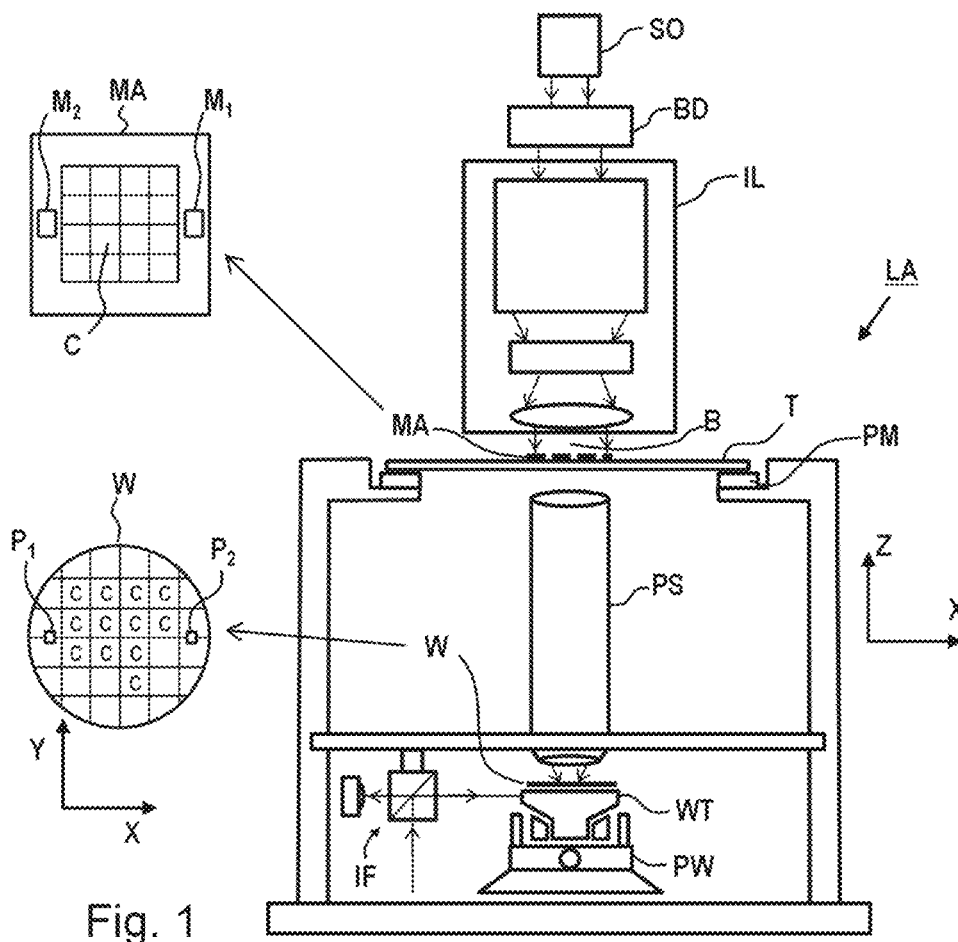
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein in its entirety by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
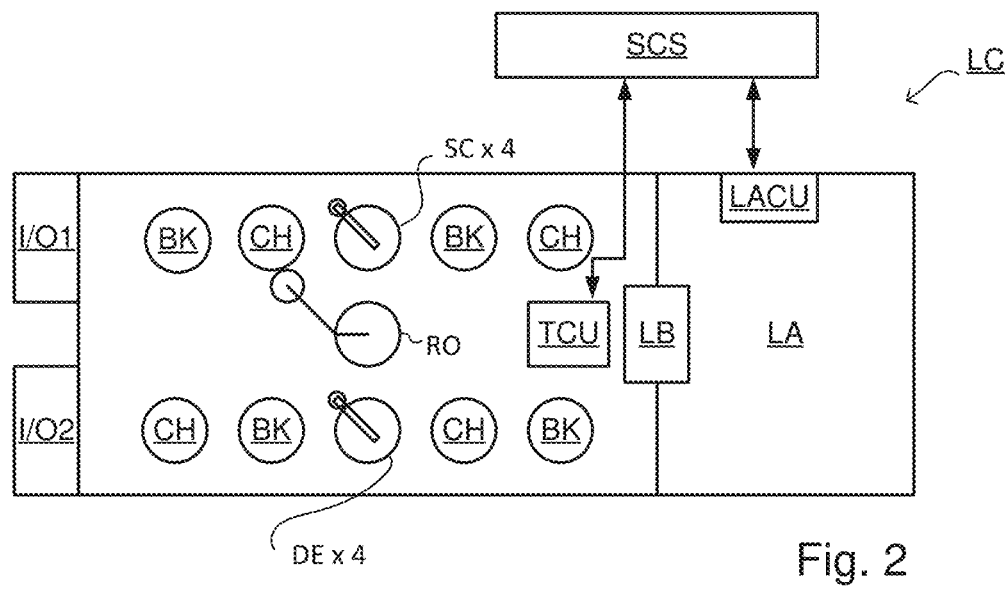
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer.

The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
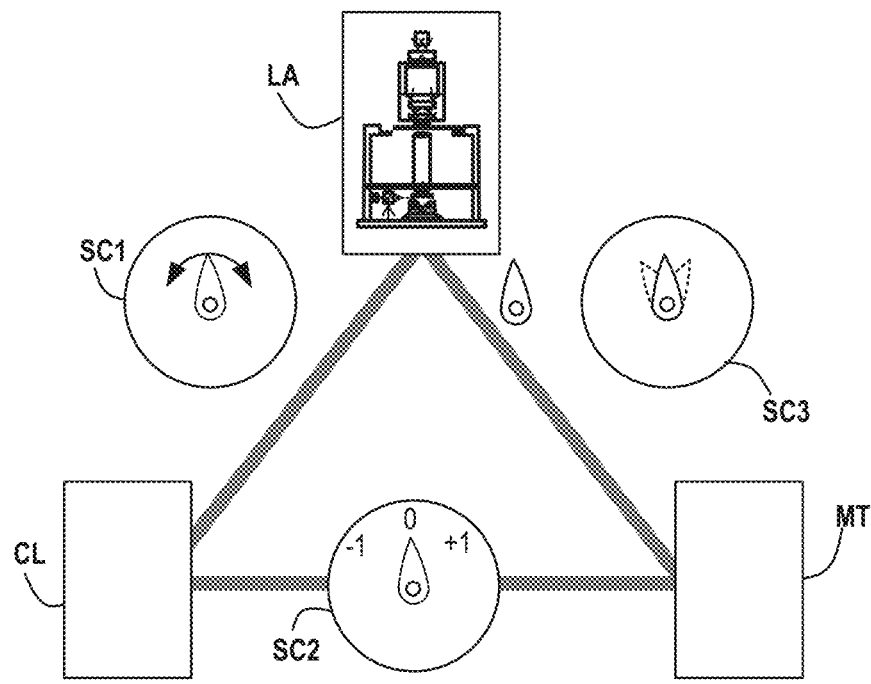
FIG. 3 depicts a schematic representation of holistic lithography, representing a cooperation between three technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). A goal of such a "holistic" environment is to optimize the cooperation between these three systems to enhance the overall process window and provide tight control loops to help ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. patent application publication nos. US20100328655, US2011102753, US20120044470, US20110249244, US20110026032 and European patent application publication no. EP1,628,164, each of the foregoing patent application publications is incorporated herein in its entirety by reference. Aforementioned scatterometers may measure gratings using radiation from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization state. Such metrology apparatus emits polarized radiation (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application publication nos. 2007-0296960, 2008-0198380, 2009-0168062, 2010-0007863, 2011-0032500, 2011-0102793, 2011-0188020, 2012-0044495, 2013-0162996 and 2013-0308142, each of which is incorporated herein in its entirety by reference.

Figure 4:
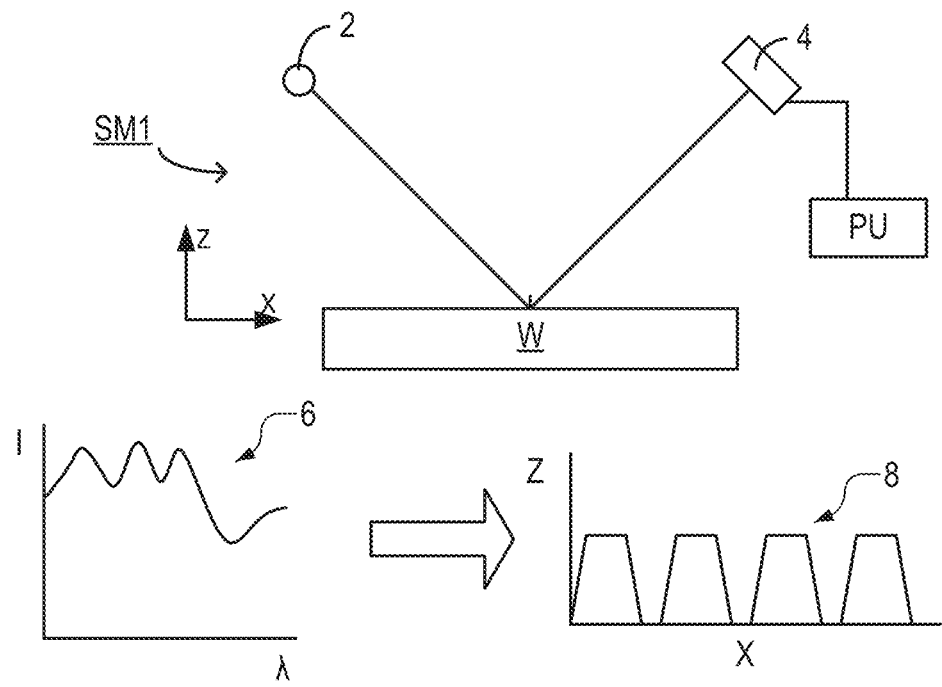
FIG. 4 depicts a schematic overview of a scatterometry apparatus used as a metrology device, which may comprise a radiation source according to embodiments of the invention.

A metrology apparatus, such as a scatterometer, is depicted in FIG. 4. It comprises a broadband (white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Overall measurement quality of a lithographic parameter via measurement of a metrology target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in U.S. patent application publication nos. US 2016-0161863 and US 2016/0370717, each of which is incorporated herein in its entirety by reference.

Another type of metrology tool used in IC manufacture is a topography measurement system, level sensor or height sensor. Such a tool may be integrated in the lithographic apparatus, for measuring a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 5:
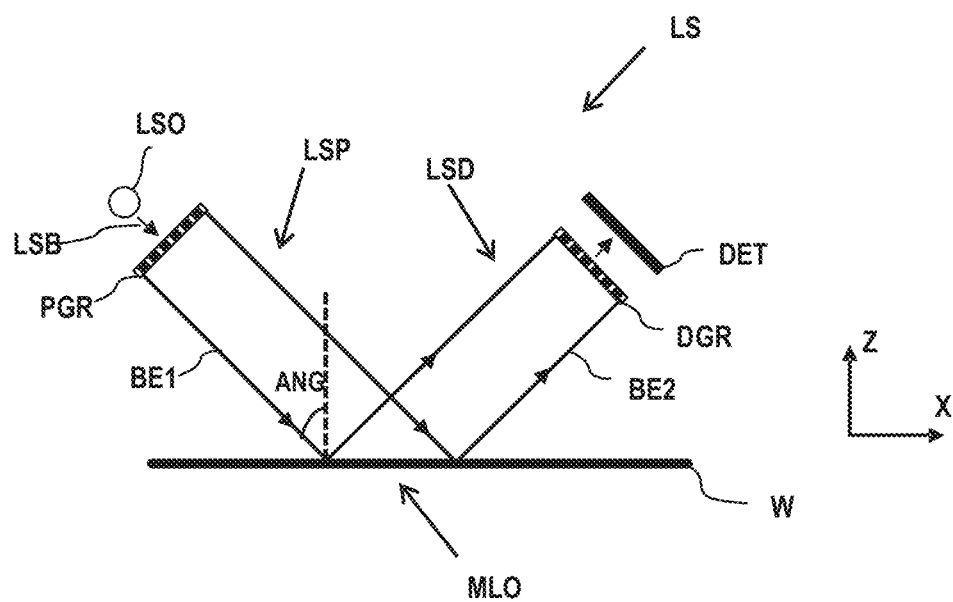
FIG. 5 depicts a schematic overview of a level sensor apparatus which may comprise a radiation source according to embodiments of the invention.

An example of a level or height sensor LS is schematically shown in FIG. 5, which illustrates only the principles of operation. In this example, the level sensor comprises an optical system, which includes a projection unit LSP and a detection unit LSD. The projection unit LSP comprises a radiation source LSO providing a beam of radiation LSB which is incident on a projection grating PGR of the projection unit LSP. The radiation source LSO may be, for example, a narrowband or broadband radiation source, such as a supercontinuum radiation source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is redirected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the radiation received, for example indicative of the intensity of the radiation received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of reference beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, each of which is incorporated herein in its entirety by reference. A height sensor using UV radiation instead of visible or infrared radiation is disclosed in U.S. patent application publication no. US2010233600, which is incorporated herein in its entirety by reference. In PCT patent application publication no. WO2016102127A1, which is incorporated herein in its entirety by reference, a compact height sensor is described which uses a multi-element detector to detect and recognize the position of a grating image, without needing a detection grating.

Another type of metrology tool used in IC manufacture is an alignment sensor. A significant aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks or targets. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor for a lithographic apparatus is based on a self-referencing interferometer as described in U.S. Pat. No. 6,961,116, which is incorporated herein in its entirety by reference. Various enhancements and modifications of the position sensor have been developed, for example as disclosed in U.S. patent application publication no. US 2015-261097, which is incorporated herein in its entirety by reference.

Figure 6:
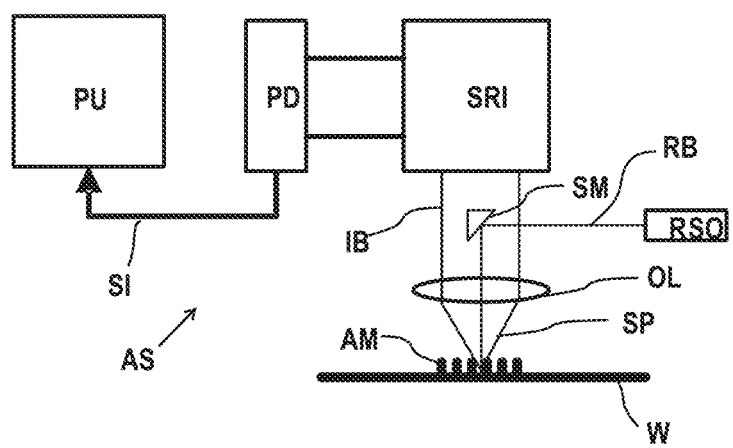
FIG. 6 depicts a schematic overview of an alignment sensor apparatus which may comprise a radiation source according to embodiments of the invention.

FIG. 6 is a schematic block diagram of an embodiment of an alignment sensor AS, such as is described, for example, in U.S. Pat. No. 6,961,116, which is incorporated herein in its entirety by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in width (e.g., diameter) than the width of the mark itself.

Radiation diffracted by the alignment mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

For optical semiconductor metrology, inspection applications, such as in any of the aforementioned metrology tools, a bright radiation source which outputs coherent radiation, simultaneously covering a broad wavelength range (e.g., from UV to IR), is often desired. Such a broadband radiation source can help improve the flexibility and robustness of applications by allowing substrates with different material characteristics to be optically examined in the same setup/system without a need for any hardware change (e.g., changing a radiation source so as to have a specific wavelength). Allowing the wavelength to be optimized for a specific application also means that the accuracy of measurements can be further increased.

Gas lasers, which are based on the gas-discharge effect to simultaneously emit multiple wavelengths, can be used in these applications. However, intrinsic issues such as high intensity instability and low spatial incoherence associated with gas lasers can make them unsuitable. Alternatively, outputs from multiple lasers (e.g., solid-state lasers) with different wavelengths can be spatially combined into the optical path of a metrology or inspection system so as to provide a multiple wavelength source. The complexity and high implementation costs, which increases with the number of wavelengths desired, prevents such a solution from being widely used. In contrast, a fiber-based broadband or white light laser, also called a supercontinuum laser, is able to emit radiation with high spatial coherence and broad spectral coverage, e.g., from UV to IR, and therefore is a very attractive and practical option.

A hollow-core photonic crystal fiber (HC-PCF) is a special type of optical fiber that comprises a central hollow core region and an inner cladding structure surrounding the hollow core, both of which extend axially along the entire fiber. The radiation guidance mechanism is enabled by the inner cladding waveguide structure, which may comprise, for example, thin-walled glass elements. The radiation is thus confined predominantly inside a hollow core and propagates along the fiber in the form of transverse core modes.

A number of types of HC-PCFs can be engineered, each based on a different physical guidance mechanism. Two such HC-PCFs include: hollow-core photonic bandgap fibers (HC-PBFs) and hollow-core anti-resonant reflecting fibers (HC-ARFs).

HC-PCFs comprise hollow channels which are filled with a fluid, such that they possess resultant desired characteristics for various radiation guiding applications; for example, high-power beam delivery using HC-PBFs and gas-based white light generation (or supercontinuum generation) using HC-ARFs. Detail on the design and manufacture of HC-PCFs can be found in U.S. patent application publication no. US2004-0175085 (for HC-PBFs) and European patent application publication no. EP3136143 (for HC-ARFs), each of which is incorporated herein in its entirety by reference. HC-PBFs are configured to offer low loss but narrow bandwidth radiation guidance via a photonic bandgap effect established by the cladding structure surrounding the central hollow core. Whereas HC-ARFs are engineered to significantly broaden the transmission bandwidth via anti-resonant reflection of radiation from the cladding.

Figure 7A:
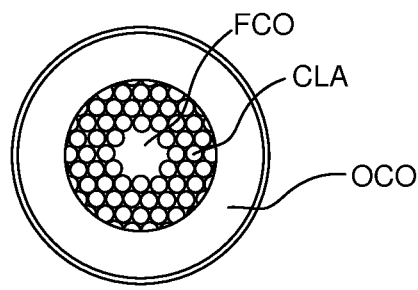
FIGS. 7A and 7B schematically depict the transverse cross-sections of two HC-PCF designs for radiation light generation, including a Kagome design as depicted in FIG. 7A and a single-ring design as depicted in FIG. 7B.
Figure 7B:
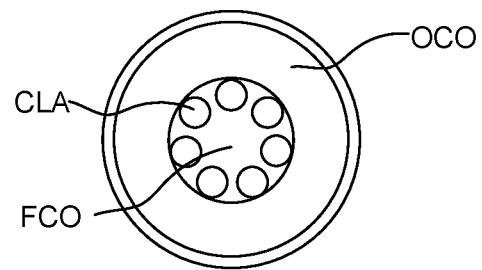

FIG. 7 depicts in cross-section, two types of HC-ARFs. FIG. 7A shows a Kagome fiber, comprising a Kagome lattice structure as its cladding CLA defining a hollow fiber core FCO. This arrangement may be surrounded by one or more outer coatings OCO. FIG. 7B shows a single-ring or revolver fibers, where the hollow core region FCO is formed and surrounded by a layer of non-touching rings CLA.

For gas-based radiation (e.g., white light) generation, a HC-ARF may be comprised within a gas cell, which is designed to operate, for example, at a pressure up to many 10s of bars (e.g., between 3-100 bar). A gas-filled HC-ARF can act as an optical frequency converter when being pumped by an ultrashort pump laser pulse with sufficient peak power. The frequency conversion from ultrashort pump laser pulses to broadband laser pulses is enabled by a complicated interplay of the dispersion and nonlinear optical processes inside the gas-filled fiber. The converted laser pulses are predominantly confined within the hollow core in the form of transverse core modes and guided to the fiber end. Transverse core modes that are supported by the fiber can be described as linear polarized (LP) modes. In the LP notation, an LP mode is referred to as $LP_{mn}$, where m and n subscripts are integers representing the azimuthal and radial order of a particular mode. The fundamental mode is $LP_{01}$ mode. Part of the radiation, for example higher order transverse core modes or specific wavelengths, may leak from the hollow core through the inner cladding waveguide structure and undergoes strong attenuation during its propagation along the fiber. The core region and the cladding region of a HC-ARF can be configured such that the higher order core modes are phase matched to the higher order cladding modes. In this way, the higher order core modes can resonantly couple with the higher order cladding modes which subsequently get attenuated or suppressed. In such a manner, low loss and effectively single transverse mode transmission can be obtained in a broad spectral range.

One or more spatio-temporal transmission characteristics of a laser pulse, e.g. its spectral amplitude and phase, transmitted along a PCF (such as an HC-PCF) can be varied and tuned through adjustment of one or more pump laser parameters, one or more filling gas parameters, one or more fiber parameters and/or one or more pump coupling conditions. The one or more transmission characteristics may include one or more selected from: output power, output mode profile, output temporal profile, width of the output temporal profile (or output pulse width), output spectral profile, and/or bandwidth of the output spectral profile (or output spectral bandwidth). The one or more pump laser parameters may include one or more selected from: pump wavelength, pump pulse energy, pump pulse width, and/or pump pulse repetition rate. The one or more fiber parameters may include one or more selected from: fiber length, size and/or shape of the hollow core, size and/or shape of the cladding structure, and/or thickness of the walls surrounding the hollow core. The one or more filling gas parameters may include one or more selected from: gas type, gas pressure and/or gas temperature. The one or more pump coupling conditions, determining how well a pump laser beam is coupled into a fiber core, may include one or more selected from: angular offset of the pump laser beam with respect to the fiber core, lateral offset of the pump laser beam with respect to the fiber core and/or mode matching between the pump laser beam and the fiber core. The mode matching between the pump laser beam and the fiber core may be determined by one or more parameters such as beam width (e.g., diameter) of the pump laser beam, divergence of the pump laser beam, width (e.g., diameter) of the hollow core and/or numerical aperture (NA) of the hollow core.

The filling gas of a HC-PCF can be a noble gas such as helium, neon, argon, krypton, xenon, a Raman active gas such as hydrogen, deuterium, and/or nitrogen, or a gas mixture such as an argon/hydrogen mixture, a xenon/deuterium mixture, a krypton/nitrogen mixture, or a nitrogen/hydrogen mixture. Depending on the type of filling gas, the nonlinear optical processes can include modulational instability (MI), soliton fission, Kerr effect, Raman effect and/or dispersive wave generation, details of which are described in PCT patent application publication no. WO2018/127266A1 and U.S. Pat. No. 9,160,137, each of which is incorporated herein in its entirety by reference. Since the dispersion of the filling gas can be tuned by varying the gas cell pressure, the generated broadband pulse dynamics and the associated spectral broadening characteristics can be adjusted so as to optimize the frequency conversion. The generated broadband laser output can cover wavelengths from UV (e.g., <200 nm) to mid-IR (e.g., >2000 nm).

When applied to semiconductor metrology and alignment applications, such as in any of the aforementioned metrology tools, the transverse mode of the output radiation of a HC-PCF based broadband radiation source is desired to be the fundamental transverse mode, i.e. $LP_{01}$. In other words, a broadband laser beam with a high or maximized mode purity, defined as the ratio between the power in the fundamental transverse mode and the total output power, is typically desired. This is due to the fact that the fundamental transverse mode has a much lower transmission loss through a PCF (e.g., a HC-PCF) than that of higher order modes (HOMs). Hence, it is more power efficient if all the pump radiation is coupled into the fundamental transverse mode of the fiber. Furthermore, the presence of HOMs degrades the mode quality and/or intensity stability of the broadband output. In many applications where a Gaussian beam profile is desired, a broadband output with a poor mode purity will experience a significant power loss as the HOM content of the output will be removed, e.g., by spatial filtering, during transmission. The degradation of the intensity stability results in high measurement noise and/or poor measurement consistency.

Figure 8:
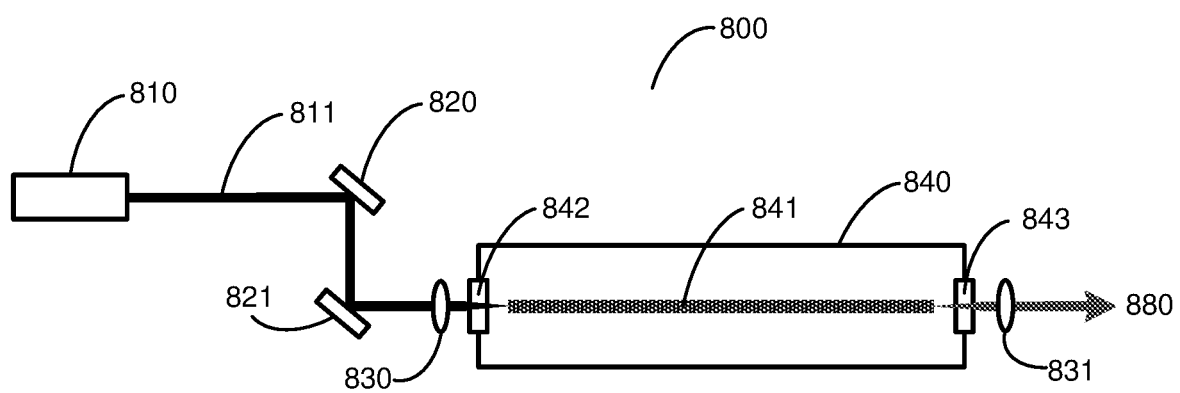
FIG. 8 schematically depicts an exemplary gas filled HC-PCF based broadband radiation source device.

FIG. 8 schematically illustrates an exemplary HC-PCF based broadband radiation source 800. A collimated pump laser beam 811, comprising a train of pump pulses at a specific repetition rate, is output from a pump laser 810 and used as an input laser beam for generation of broadband radiation in the HC-PCF 841. The propagation of the collimated pump laser beam is controlled by one or more beam steering components (e.g., forming part of a beam delivery system), here depicted as two steering mirrors 820 and 821 and is directed to pass through a focusing lens 830. The focusing lens creates a suitable focus of the pump laser beam which is mode matched to the fiber core of the HC-PCF 841. The focused pump laser beam transmits through an input optical window 842 before being coupled into the core of the HC-PCF 841. The HC-PCF 841, having a specific fiber length, may employ the Kagome design or the single-ring design with reference to FIG. 7. Alternatively, one or more other fiber designs (not shown) such as a solid core design, an inhibited coupling design, a hypocycloid-core Kagome, and/or a nested tubular design may be used. In this example, the entire HC-PCF 841 is comprised in a single pressure-tight gas cell 840 filled with a working gas or a gas mixture at a specific pressure or with a pressure distribution. After being coupled into the gas-filled HC-PCF, pump laser pulses propagate along the fiber where they experience significant spectral broadening. Resultant broadband laser pulses 880 are subsequently discharged from the gas cell 840 via the output optical window 843. The broadband laser beam 880 is then collimated by a collimating lens 831 to a suitable beam size.

To fill the HC-PCF with a working gas, the gas cell may be in communication with a pressurized gas supply or reservoir (not shown). The inner surfaces of the walls and windows of the gas cell enclose a cavity. In an embodiment, the axis of the gas cell is substantially parallel to the axis of the HC-PCF.

The pump pulse duration may be chosen to be greater than 10 fs, and more specifically within the range of: 10 fs to 100 ps, 10 fs to 30 ps or 10 fs to 1 ps. The pump wavelength may be chosen from the visible regime, near-IR regime or mid-IR regime. The pump laser pulses may have a repetition frequency of several-hundred hertz (Hz), kilohertz (kHz), or megahertz (MHz). In particular the repetition rate may be chosen to be in the range of 100 kHz to 100 MHz, such as 100 kHz, 500 kHz, 1 MHz, 5 MHz, 10 MHz, 20 MHz, 30 MHz, 40 MHz.

The alignment of the pump laser beam with respect to the HC-PCF may comprise two main steps, i.e., coarse alignment and fine alignment. Coarse alignment is performed at a sufficiently low pump pulse energy or pump power to prevent damage to the HC-PCF. This step is to help ensure the pump beam is properly coupled into the hollow core of the HC-PCF and the transverse core modes are excited at the front (or input) facet of the HC-PCF. Without coarse alignment, damage might occur when the center of the high power pump laser beam hits a cladding wall of the HC-PCF. Once the transverse core modes are excited and transmission efficiency, defined as the ratio between the fiber output power and the fiber input power, is maximized at the low power level, fine alignment at a high power level is started. Again, the purpose of fine alignment is to further maximize the transmission efficiency. However, in a conventional optimization method, a maximized transmission efficiency (i.e. a maximized output power at a given input power) does not necessarily correspond to the highest mode purity. In other words, HOM content can still be present in the output of a broadband radiation source even after the transmission efficiency is optimized. A main reason for this discrepancy is that the transverse beam profile of the pump laser beam is typically imperfect, i.e. $M^2>1$. Hence, no matter how well the overall transmission efficiency is optimized, HOMs will be excited.

Both coarse alignment and fine alignment (e.g., as part of a pump coupling optimization) can be enabled by one or more selected from: 1) movement of at least one beam steering component in a beam delivery system (represented as two steering mirrors in the FIG. 8 and other Figures, although this is a purely exemplary beam delivery system); 2) movement of the gas cell and/or 3) movement of the focusing lens (if available). The one or more beam steering components or steering mirrors may be held by one or more kinematic mirror mounts which can be adjusted manually and/or electrically via one or more actuators such as one or more piezoelectric actuators. Mirrors may be fixed by any suitable fixing arrangement, such as for example directly adhering a portion of their back surfaces to the mirror mounts or by using a setscrew. The gas cell may be mounted on a stage module comprising one or more (e.g., piezo) stages. The stage module may provide movement with multiple degrees of freedom, e.g., six degrees of freedom. Additionally or alternatively, the alignment of the pump laser beam with respect to the HC-PCF can be achieved by inserting one or more extra optical components into the beam path of the pump laser beam (e.g., as part of a beam delivery system or otherwise). Such one or more optical components may comprise, for example, two or more (rotatable) optical wedges or any one or more other optical components that can generate desired movement (angular and/or lateral) of the input pump laser beam. Any one or more of these alignment strategies and methods may be used in a pump coupling optimization of methods described herein.

In order to achieve a good mode matching between the pump laser beam and the fiber core, the pump laser beam may be focused by an optical element (e.g., lens) before entering into the fiber, the lens properties being such that the divergence and the width (e.g., diameter) of the focused pump laser beam is well matched with the numerical aperture (NA) and the mode field width (e.g., diameter) of the fiber core. Since the characteristics of the focused pump laser beam are determined by the lens when the input pump laser beam is fixed, a different HC-PCF may have different fiber characteristics and therefore may require a different focusing lens for an optimal mode matching. Similarly, when characteristics of the HC-PCF are fixed, a different pump laser beam, e.g., having a different beam width or beam divergence, may require a different focusing lens to keep the focused beam width the same.

The presence of HOMs degrades the mode quality as well as the intensity stability of the broadband output. The inconsistency in mode purity across the full output spectrum results in wavelength dependent output performance, which will negatively impact the reliability and repeatability of the metrology data should such a broadband radiation source be used in any of the aforementioned metrology tools. Typically, a HOM is triggered when one or more pump coupling conditions are not optimized. In some situations where the mode purity of a broadband radiation source is fully optimized across the full output spectral range, HOMs can still appear at the output after a certain amount of runtime. The appearance of HOMs during operation is caused by e.g., thermal and/or vibrational drifts induced degradation of pump coupling conditions.

Referring back to the exemplary setup of a broadband radiation source in FIG. 8, a small amount of the incident pump laser beam can leak through the reflective surface of a beam steering component such as a steering mirror and be incident on the component mounting mechanism. This pump leakage can heat up the mounting mechanism and change its condition. For example, this heating can cause softening of an adhesive used to bond the component to the mounting mechanism, resulting in a small misalignment of the component and hence the pump laser beam with respect to the HC-PCF. Due to the fact that HC-PCF based broadband radiation sources are alignment sensitive, a misalignment of the pump laser beam with respect to the HC-PCF can significantly degrade the coupling condition of the pump laser beam into the fiber core, resulting in the generation of HOMs and/or the degradation of mode purity of the broadband output. Misalignment and/or a change of alignment of the pump laser beam could also be induced by one or more other factors, such as ambient temperature oscillations or external vibrations. In a similar manner, thermal and/or vibrational drifts of the HC-PCF can result in the appearance of HOMs and/or the degradation of mode purity of the broadband output.

Therefore, there is a desire to optimize and/or stabilize the broadband output, in particular the $LP_{01}$ mode, during operation of a broadband radiation source. A mode control method and apparatus is therefore proposed for addressing the above-mentioned mode purity issue associated with a PCF based broadband radiation source.

Figure 9:
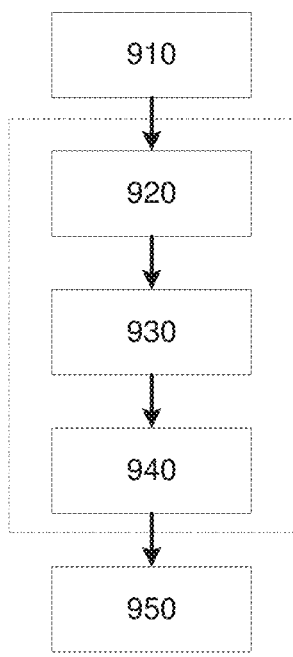
FIG. 9 is a flowchart describing an operating procedure of a mode control system, in accordance with an embodiment of the invention.

FIG. 9 illustrates an operating procedure of the proposed mode control system in accordance with an embodiment. At step 910, one or more parameters of the broadband output beam are measured. Such one or more beam parameters (i.e., one or more parameters of the broadband output beam) are indicative of the output performance in respect of the fundamental mode purity. At step 920, the measured data is processed. At step 930, the processed data is evaluated by following a pre-defined set of criteria. The detail of steps 910 to 930 is largely dependent on the beam parameter(s) being monitored and/or the hardware set-up and more detailed examples of these steps will be described below. According to the outcome of such evaluation, a control signal will be generated at step 940. At step 950, the control signal is used to control one or more components of the broadband radiation source. The control of such one or more components of the broadband radiation source optimizes pump coupling conditions such that the mode purity in terms of the fundamental transverse mode $LP_{01}$ is increased or maximized.

The optimization of pump coupling conditions can be achieved in various ways. Any method which improves the coupling of the pump laser into the PCF can be used, and can be effected by moving the pump beam with respect to the PCF (e.g., via beam steering components or otherwise), moving the PCF with respect to the pump beam or moving both in combination; or alternatively or additionally by changing the position or configuration of any intervening optical component such as a focusing component. This can be performed while monitoring the reference beam (and therefore the output beam) to help ensure mode purity is optimized. As such, the method may be implemented in closed-loop operation such that the change of the transverse mode of the broadband output can be continuously monitored and optimized. Depending on the type of beam parameter monitored, different detection mechanisms may be used, each of which may require one or more different measuring devices or components.

Figure 10:
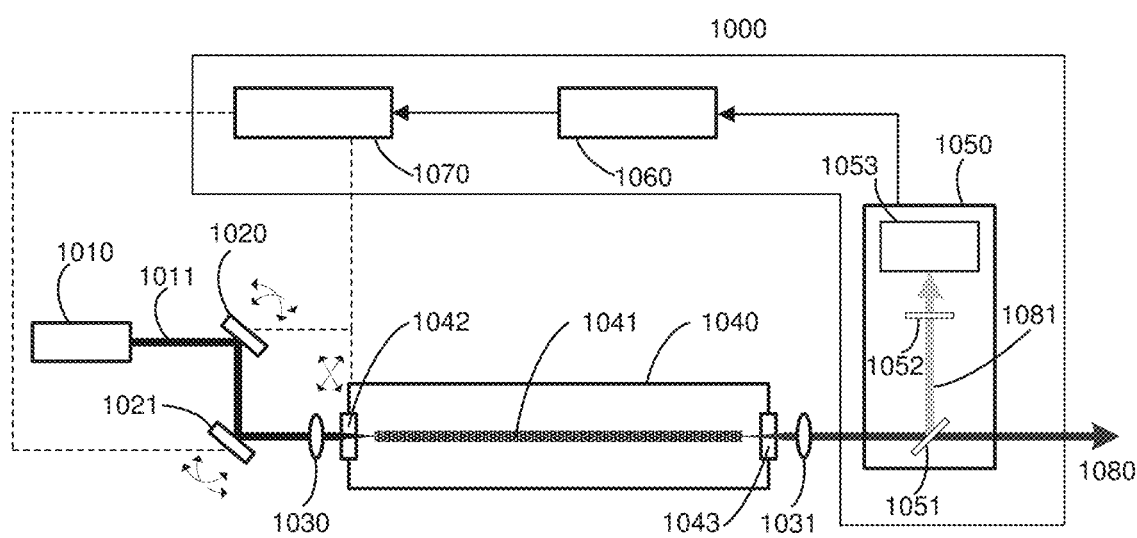
FIG. 10 schematically depicts a broadband radiation source equipped with a mode control system, in accordance with an embodiment of the invention, for optimization and stabilization of the fundamental transverse mode $LP_{01}$ of the radiation source.

FIG. 10 schematically illustrates a broadband radiation source equipped with a mode control system 1000, in accordance with an embodiment, for optimization and stabilization of the fundamental transverse mode $LP_{01}$ of the radiation source. In this embodiment, the broadband radiation source is essentially similar to the exemplary radiation source 800 illustrated in FIG. 8. For brevity, equivalent components and features may be provided with like reference numerals in remaining Figures after the introduced of the reference numeral instead of being individually described (e.g., labels 811 in FIG. 8, 1011 in FIG. 10, 1111 in FIG. 11, etc. all describe the pump laser beam).

As illustrated in FIG. 10, part of the main broadband output beam 1080 is reflected by the front surface of beam splitter 1051 (which optionally may be comprised within the detection unit 1050) and used as a reference beam 1081. It is noted that the beam splitter 1051 should not cause any spatial and spectral distortion to the reference beam, such that reference beam 1081 and the main broadband output beam 1080 are considered to share same beam characteristics. The reference beam 1081 is used by a mode control system 1000 for optimization and stabilization of the fundamental transverse mode $LP_{01}$ of the broadband radiation source. The mode control system 1000 comprises a detection unit 1050, a processing unit 1060 and a control unit 1070. The detection unit 1050 measures one or more parameters of the broadband output. The resultant measurement data is sent to the processing unit 1060 for data processing and evaluation. Based on a result of the evaluation, a control signal is generated and used by the control unit 1070 to control one or more beam control system components accordingly. Such one or more beam control system components may comprise, for example, one or more beam delivery or beam steering components (e.g., the steering mirror 1020, the steering mirror 1021 or an actuator therefor), an actuator or stage which moves the gas cell 1040, an actuator which moves the (optional) focusing lens 1030 and/or an actuator which alters the absolute polarization angle (e.g., where the HC-PCF is polarization maintaining, and a certain absolute orientation of the polarization of the radiation is desired), such as a rotating polarizer. The data measurement and evaluation may be performed in a continuous or periodical manner.

In an embodiment, the detection unit comprises a bandpass filter 1052 and an illumination measuring device such as power measuring device 1053, (e.g., a power meter) arranged such that the power measuring device 1053 measures the power of the broadband output in the spectral range of the passband of the filter. Optionally, the bandpass filter 1052 arrangement may have a variable passband arrangement. In this way, a plurality of power values measured in a plurality of spectral ranges can be obtained, each power value corresponding to each spectral range of each bandpass filter. This may be effected by mounting the bandpass filter 1052 on a filter wheel together with one or more different bandpass filters such that, on completion of a power measurement (which corresponds with step 910 of the method of FIG. 9) in a particular spectral range, the filter wheel can be rotated so as to enable a different bandpass filter. Other arrangements of obtaining variable bandpass characteristics may be envisaged, including providing a movable high-pass and movable low-pass continuously variable filter in series for example.

The measured power values from power measuring device 1053 and the spectral information of the bandpass filter(s) used in the measurements are then sent to the processing unit 1060 to calculate one or more spectral parameter values, such as one or more power spectral density (PSD) or one or more energy spectral density (ESD) values (this corresponds with step 920 of the method of FIG. 9). The calculated one or more spectral parameter values are subsequently evaluated (this corresponds with step 930 of the method of FIG. 9) in the processing unit 1060 by following a certain set of criteria. The processing unit 1060 may comprise a processor which is configured to process the measured data and subsequently perform evaluation on the processed data. Alternatively or in addition, the evaluation may be performed directly on the measured one or more values.

During data evaluation, the calculated one or more spectral parameter values may be compared with one or more reference spectral parameter values in corresponding spectral ranges and, based on the comparison, a set of deviation values generated; where a deviation value comprises a measure of the degree of deviation of a calculated spectral parameter value with respect to the reference spectral parameter value. The one or more reference spectral parameter values may correspond to a mode purity of the broadband output beam indicative of an optimal output. The set of deviation values may be evaluated against a set of predefined deviation thresholds for corresponding spectral ranges in order to determine whether the pump coupling conditions of the broadband radiation source are acceptable. The predefined deviation thresholds may be set to a percentage in the range of, for example, 5% to 25% of the reference spectral parameter values (e.g., 5%, 10%, 15% or 20% of the reference spectral parameter values). If the deviation values are indicative of unacceptable pump coupling conditions such that the mode purity of the broadband output is sub-optimal, a control signal is generated and/or varied accordingly (this corresponds with step 940 of the method of FIG. 9). Based on the control signal, the control unit 1070 will command one or more components so as to improve/optimize the pump coupling conditions and improve or maximize mode purity of the broadband output (this corresponds with step 950 of the method of FIG. 9).

A couple of specific, and purely exemplary, methods for optimization of pump coupling conditions will now be described, where the control unit 1070 (or processing unit 1060) may command two beam steering components (e.g., steering mirrors 1020, 1121) to be incrementally scanned in both horizontal and vertical directions. The horizontal direction is defined to be parallel to the optical table plane and the vertical direction is defined to be perpendicular to the table plane. This scanning implementation is applicable to all embodiments described herein, although the beam parameter(s) being monitored may be different for later embodiments (as will be apparent).

In a first such specific scanning implementation, this scanning may be performed by scanning a first of the mirrors (e.g., mirror 1020) in a meandering or zig-zag path: e.g., it may be commanded to scan repetitions of the following sequence: a first incremental scan in a desired range in the x direction and a single movement in the y direction, repeated to cover a desired range in the y direction. While the first mirror 1020 is scanning, the second mirror 1021 is maintained in its original position. After each incremental movement, a measurement is taken, e.g., a power measurement. In such a manner, a power map and/or a calculated PSD map in a predefined area is generated. Based on the map(s), the position of the first mirror is optimized and the second mirror, e.g., mirror 1021, will start scanning in the same manner. At the end of the mirror scanning, the position of the second mirror will also be optimized.

In the above-mentioned scanning routine, the two mirrors are decoupled. When one mirror is scanning, the other one is assumed to be maintained in an optimal position. Such an arrangement is therefore not ideal when both mirrors have drifted from their respective optimal positions. As such, in a second scanning implementation, a co-optimization of two or more beam steering components (e.g., mirrors 1020, 1021) may be performed. This specific implementation may comprise the first mirror, e.g., mirror 1020 making an incremental movement in a predefined range in x direction, followed by the second mirror, e.g., mirror 1021, scanning the full area determined by a desired range in x direction and a desired range in y direction. When the area scan by the second mirror is complete, the first mirror makes another incremental movement in the same direction and the second mirror performs another area scan. This is repeated until the first mirror reaches the end of the desired range in x direction, when it incrementally moves in y direction and performs another incremental scan in the x direction. The full mirror scanning process is complete when the first mirror has scanned the full area determined by the predefined ranges in x and y directions. As such, a power map and/or a calculated PSD map will be generated by the second mirror for each position of the first mirror and, as such, optimal mirror positions determined in this way should be more accurate.

Alternatively, or in addition to controlling (e.g., scanning) one or more beam steering components, further optimization of the output mode purity of a broadband radiation source can be achieved by controlling (e.g., incrementally scanning) the position of the gas cell 1040. The gas cell movement may be enabled by a stage module and may comprise lateral and/or angular movement in one or more directions. Furthermore, in an embodiment, the focusing lens 1030 may be mounted on a piezo stage or a stage module which allows the lens to move according to one or more degrees of freedom. Such lens movement can further optimize the mode purity of the broadband output 1080.

In a further embodiment, an assembly comprising an optical element for receiving and modifying radiation, a receiving element for receiving the modified radiation, and a gas environment enclosing the receiving element is provided, wherein the assembly further comprises a controlling element configured to stabilize a matching condition between the optical element and the receiving element by adjusting either the modifying of the received radiation or adjusting a distance between the optical element and the receiving element in dependency to a property of the gas environment.

In an example the optical element may be the focusing lens 1030 and the receiving element a non-linear optical element such as a non-linear crystal or the hollow core fiber HC-PCF 1041. The radiation may be generated by a (monochromatic) pump laser, focused (modified) by the optical element 1030 and received by the receiving element 1041 enclosed within the gas cell 1040. The gas cell 1040 may be configured to allow adjustment of one or more certain properties of the gas environment, such as pressure, temperature and/or gas composition. Typically adjustment of the gas environment is targeted to obtain a desired response of the non-linear optical process of generating broadband radiation, for example to adjust the wavelength spectrum of the broadband radiation. However changes in the one or more properties (typically temperature and/or pressure of the gas environment) may have a direct impact on a matching condition between the optical element 1030 and the receiving element 1041, such as a focus matching condition associated with an efficiency of coupling the radiation into the HC-PCF 1041. In case the one or more properties of the gas environment are pressure and/or temperature variations, basic physical principles allow estimation of the corresponding variation of the focus matching condition. The refractive index 'n' of the gas depends on the pressure P and temperature T of the gas according to equation 1 (EQ[1]):

$$n^2(\lambda, P, T) = 1 + \frac{P}{P0} * \frac{T0}{T} * \left[ \frac{B1 * \lambda^2}{\lambda^2 - C1} + \frac{B2 * \lambda^2}{\lambda^2 - C2} \right]_{P0, T0} \quad \text{EQ [1]}$$

wherein $P_0$ and $T_0$ are reference pressure and temperature values, $C_1$, $C_2$, $B_1$, $B_2$ are the Sellmeier coefficients of the gas and $\lambda$ is the wavelength of the pump laser radiation.

The variation in focal position of the pump laser radiation with respect to the entrance of the fiber 1041 due to the change in refractive index can be determined by basic optical analysis of the assembly (in particular the power of the optical element and the distance between the optical element and the receiving element). For example, a pressure change from 15 to 17 bar of a xenon filling gas will cause a refractive index increase of approximately 0.0015 in case of a 1 µm wavelength pump laser source. Using a simple optical model for a typical assembly design it can be determined that this causes a focus shift of 20-30 µm.

The pressure and/or temperature variation induced focus variation may be detrimental for the coupling efficiency of the pump laser radiation into the fiber 1041. This may translate into a reduced power of the broadband radiation generated within the fiber 1041. It is hence desired to provide focus controlling means, for example by incorporation of a controlling element, such as an actuator, providing focus control based on available information of one or more properties of the gas environment.

The optical element 1030 and/or gas cell 1040 may be configured to allow variable focusing of the pump laser radiation with respect to the entrance of the receiving element HC-PCF 1041. For example, the focusing lens 1030 and/or gas cell 1040 may be movable by the controlling element within a certain range along the optical axis of the receiving element HC-PCF 1041 (longitudinal direction). Alternatively or additionally, the focusing lens may comprise an optical surface (lens) having a variable optical power (for example the lens/optical surface being deformable by the controlling element) or a lens (elements) which may be movable by the controlling element with respect to each other.

It is further proposed to periodically measure the pressure and/or temperature of the gas by sensing means, determine a corresponding change in refractive index of the gas and subsequently determine the variation in focal position of the pump laser radiation with respect to the entrance of the receiving element 1041 due to the change in refractive index.

In an embodiment the assembly comprises a focus control system using pressure and/or temperature measurement values as an input and outputting a value corresponding to a control signal for one or more controlling elements (actuators) coupled to the focusing lens 1030 and/or gas cell 1040. The control signal may be configured to provide a focal position change at least partially compensating the determined variation in focal position of the pump laser radiation with respect to the entrance of the fiber 1041. The one or more actuators may move the focusing lens 1030 and/or the gas cell 1040 along the optical axis. The one or more actuators may position a lens (elements) comprised within the focusing lens 1030 such as to cause the focal position change. The one or more actuators may deform an optical surface or lens (element) comprised within the focusing lens 1030 such as to cause the focal position change. Alternatively or additionally, the one or more actuators may control the position and/or optical power of an additional optical element (not shown) positioned in the radiation path upstream of the gas cell to cause the focal position change.

The focus control system may comprise functionality to determine a change in refractive index of the gas based on the pressure and/or temperature measurement value, a reference value of the pressure and/or temperature, the wavelength of the pump laser radiation, and/or the composition of the gas and/or the Sellmeier coefficients corresponding to the gas.

The focus control system may comprise functionality to determine the variation of the focal position of the pump laser radiation with respect to the entrance of the fiber 1041 based on the determined variation of the refractive index of the gas and knowledge of one or more properties and/or positions of the optical elements used in coupling the pump laser radiation into the fiber 1041.

The focus control system as described herein allows automated focus adjustments in response to varying conditions of the gas (for example: temperature, pressure, gas composition) helping to assure efficient coupling of the pump laser radiation into the fiber 1041. Hence the focus control system adds to the stabilization of the power of the broadband radiation being delivered by the fiber 1041.

In an embodiment, the power of the broadband radiation is periodically measured at the output of the fiber 1041 and used instead or in addition to pressure and/or temperature measurement readout to provide the control signal for the one or more actuators. In an embodiment, a ratio between the power at the output of the fiber and at the entrance of the fiber is determined. The determined ratio may be used to provide the control signal for the one or more actuators.

Figure 11:
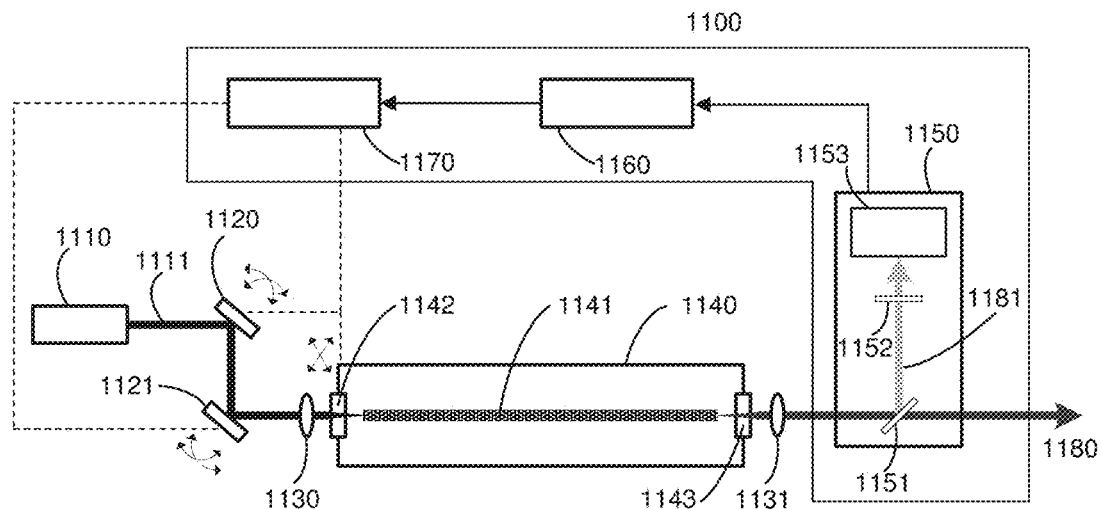
FIG. 11 schematically depicts a broadband radiation source equipped with a mode control system, in accordance with an embodiment of the invention, for optimization and stabilization of the fundamental transverse mode $LP_{01}$ of the radiation source.

FIG. 11 illustrates an embodiment of a detection unit that comprises a spatial filter 1152, which may comprise (for example) a pinhole or a single mode fiber, and a power measuring device 1153. Similar to the embodiment described in relation to FIG. 10, a reference beam 1181 is directed by the beam splitter 1151 from the broadband output beam. The spatial filter 1152 is configured to remove HOM content of the broadband output such that only the fundamental transverse mode is measured and monitored. Since the fundamental transverse mode and HOMs have different divergence angles and mode field widths (e.g., diameters), only the fundamental mode of the output beam can be efficiently coupled into the single mode fiber and the HOMs are either not coupled into the single-mode fiber or not guided to the power meter for power measurement. In a similar manner, a pinhole with a carefully chosen size, only allows the fundamental transverse mode to be transmitted and thus effectively removes the HOMs of the output beam.

After being spatially filtered, the power in the fundamental transverse mode $LP_{01}$ is measured by the power measuring device 1153 placed behind the spatial filter in the detection unit. One or more additional bandpass filters (not shown) or other filter arrangement may be used to select one or more desired spectral ranges for power measurement. When one or more pump coupling conditions are suboptimal, the output power in the fundamental transverse mode begins to drop. As soon as the power in the fundamental mode falls below a predefined power threshold, a control signal is generated and/or varied and sent to the control unit 1170. The control unit 1170 will activate an optimization routine (e.g., as described above) to optimize one or more pump coupling conditions such that the output power in the fundamental transverse mode increases sufficiently (above the threshold) indicative of improved output mode purity.

It should be noted that a power drop may be caused partly by thermal and/or vibrational drifts of the collimating lens 1131 and/or one or more other downstream optical components such as the optical beam splitter 1151 illustrated in FIG. 11. Therefore, one or more beam alignment measuring devices (not shown) can be provided in the detection unit 1150 so as to either continuously or intermittently monitor the position of the collimated output beam 1180 and the reference beam 1181. When the position of collimated output beam 1180 and/or the reference beam 1181 are confirmed to have drifted, the position of the spatial filter 1152 can be optimized accordingly to compensate for the drift.

Figure 12:
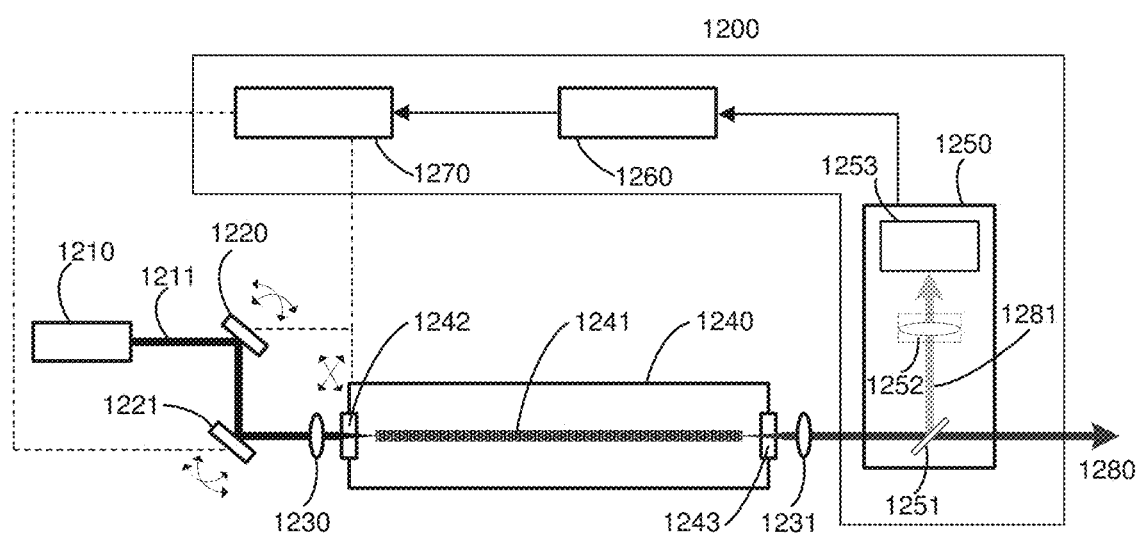
FIG. 12 schematically depicts a broadband radiation source equipped with a mode control system, in accordance with an embodiment of the invention, for optimization and stabilization of the fundamental transverse mode $LP_{01}$ of the radiation source.

According to an embodiment, as illustrated in FIG. 12, the detection unit 1250 comprises a beam shape measuring device 1253 (more generally a beam shape and/or size measuring device) which measures various (e.g., far-field) shape/size parameters of the incident reference beam 1281, such as one or more selected from: width/diameter/radius, ellipticity, centroid position, etc. The beam shape measuring device 1253 may be a scanning-slit beam profiler or a CCD camera, for example. One or more additional bandpass filters may be used to select one or more desired spectral ranges for beam profile measurement. Since the fundamental transverse mode of a HC-PCF has a Gaussian or near Gaussian field distribution and HOMs have non-Gaussian field distributions, one or more beam shape parameters such as ellipticity and/or beam width (e.g., diameter) can be used (separately or in combination) to evaluate the fundamental mode purity. Once measured, the one or more beam shape parameters are sent to the processing unit 1260 for data processing and evaluation. For example, if it is evaluated that the measured beam ellipticity is greater than a predefined ellipticity threshold, the mode purity of the broadband output beam 1280 is confirmed to be sub-optimal. The ellipticity threshold may be set to a value in a range between 1.04 and 1.20, for example. Alternatively, or in addition, the evaluation may comprise comparing the measured beam width (e.g., diameter) with a reference value of a collimated Gaussian beam calculated using the relevant parameters of the HC-PCF 1241 and the collimating lens 1231. If the difference between the measured beam width and the reference beam width is greater than a certain threshold, the mode purity of the broadband output beam 1280 is confirmed to be sub-optimal. In an embodiment, both size and ellipticity are measured and evaluated against respective thresholds as one of these parameters alone may not always be completely indicative of mode purity. Alternatively, or in addition, such a method may monitor one or more Laguerre-Gaussian mode shapes of the beam and fit these to Laguerre-Gaussian polynomials indicative of mode purity (or otherwise). Alternatively or in addition, one or more Zernike polynomial shapes can be monitored and fitted in a similar manner. Once sub-optimal mode purity is confirmed, a control signal is generated and/or varied by the processing unit 1260 and sent to the control unit 1270 for pump coupling optimization routine.

In an embodiment, an optical lens 1252 may be comprised within the detection unit to image the end facet of the HC-PCF 1241 onto the beam shape measuring device 1253. In comparison to the example described above, where far-field distribution of the output mode is evaluated, this example instead uses near-field distribution of the HC-PCF output for mode evaluation. Similarly, the ellipticity and/or the width (e.g., diameter) of the near field distribution are evaluated against one or more theoretical and/or empirical values. One or more empirical values derived experimentally might be more reliable in some cases.

Figure 13:
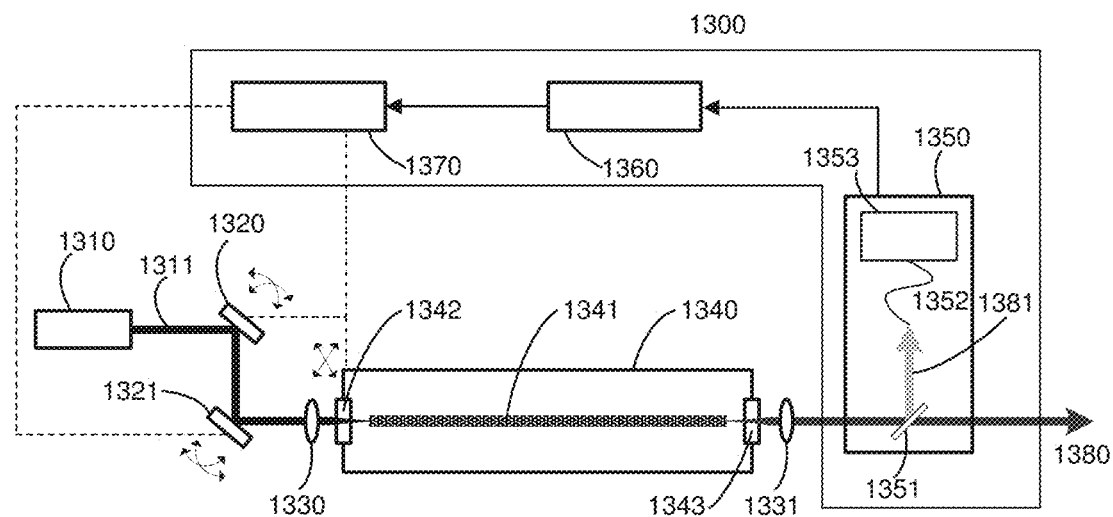
FIG. 13 schematically depicts a broadband radiation source equipped with a mode control system, in accordance with an embodiment of the invention, for optimization and stabilization of the fundamental transverse mode $LP_{01}$ of the radiation source.

According to an embodiment, as illustrated in FIG. 13, the detection unit 1350 comprises a spectrum measuring arrangement; specifically: a multimode fiber 1352, and an optical spectrum measuring device (e.g., optical spectrometer or optical spectrum analyzer) 1353. One end of the multimode fiber 1352 is placed into the beam path and used to receive at least part of the reference beam 1381. The other end of the multimode fiber is optically connected to the optical spectrum measuring device 1353 which is configured to analyze spectral characteristics of the reference beam 1381. The intensity of the reference beam 1381 may be attenuated/controlled by a neutral density (ND) filter (not shown) to avoid damage of the fiber facet and/or saturation of the optical spectrum measuring device. In a different embodiment, the multimode fiber 1352 may not be required. The reference beam may be free-space coupled into the optical spectrum measuring device.

Similar to the embodiment where measured spectral parameter values (e.g., PSD values) are compared with reference values in corresponding spectral ranges, in this embodiment, the spectral parameter values (e.g., measured spectrum) may be compared with a reference spectrum which may be acquired when the mode purity of the broadband output beam is known to be optimal. Depending on the extent of difference between the measured spectrum and the reference spectrum, a control signal will be generated and a pump coupling optimization performed.

Figure 14:
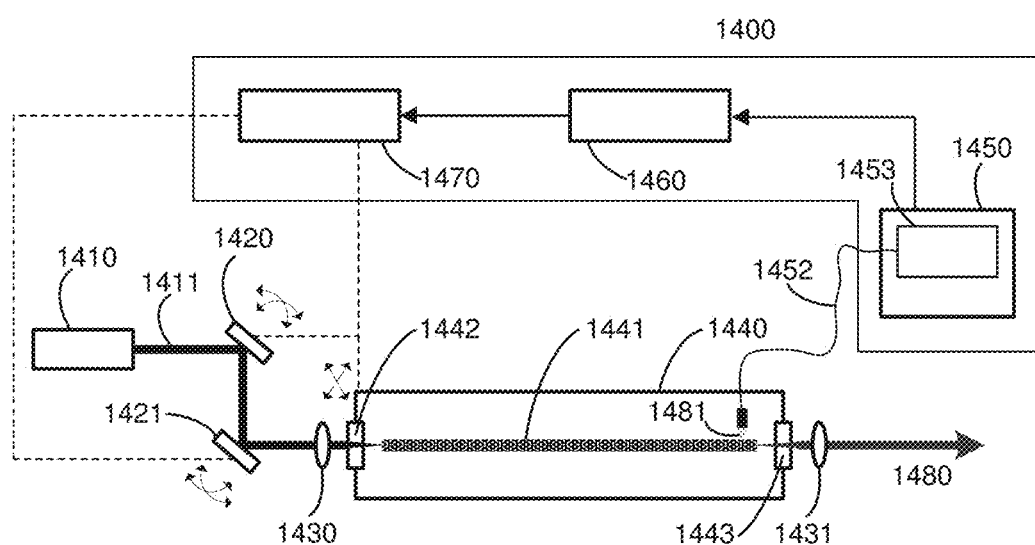
FIG. 14 schematically depicts a broadband radiation source equipped with a mode control system, in accordance with an embodiment of the invention, for optimization and stabilization of the fundamental transverse mode $LP_{01}$ of the radiation source.

In an embodiment, as illustrated in FIG. 14, radiation 1481 leaking through the fiber cladding is collected, e.g., by a multimode fiber 1452. This radiation 1481 may be collected from only a section of HC-PCF 1441, e.g., at or near an end section of HC-PCF 1441 (e.g., at or near the output end), where the outer coating may be stripped. The collected leaking radiation 1481 is then guided to an optical spectrum measuring device 1453 for spectrum measurement. Higher order fiber core modes in an HC-PCF will experience a higher confinement loss than the fundamental $LP_{01}$ core mode as they propagate along the fiber. Hence, in the case where the mode purity has degraded or is sub-optimal, more power will leak through the cladding structure, giving rise to an increased amplitude of the measured spectrum. Therefore, the amplitude of the measured spectrum can be used to assess whether the mode purity of the broadband output is optimal or not (e.g., by comparison to a threshold). If the mode purity turns out to be sub-optimal, a control signal will be generated by the processing unit and a pump coupling optimization routine will be activated by the control unit.

In addition to embodiments based on improving coupling based on a power or energy metric or beam shape metric, other parameters of the emitted radiation may be measured such as polarization extinction and/or polarization angle. Note that these latter parameters cannot be measured directly from a beam nor radiation emitted from the cladding of the fiber, and are only partially measurable from the beam or the radiation coming from the secondary axis of a beam splitter.

The above pump coupling optimization methods relate predominately to the fine alignment aspects of the alignment of the pump laser beam with respect to the HC-PCF. Improvements predominately for coarse alignment will now be described. It is to be noted that the solution spaces of the above pump coupling optimization method and the hereinafter discussed improvements may overlap. For example, the above discussed pump coupling optimization method may also have its benefits for coarse alignment, and the hereinafter discussed improvements may also provide some fine alignment. The proposed methods and apparatuses use one or more suitable detectors (e.g., photo-diodes and/or optical power meters) to monitor the HC-PCF cladding, and more specifically, the radiation escaping the HC-PCF radially. The concepts in this embodiment are similar to that for the fine alignment (mode purity evaluation) described in relation to FIG. 14. It can be appreciated that the methods of any of the foregoing embodiments may be used independently of or in combination with any of the embodiments disclosed above, in the latter case such that any of the foregoing embodiment is used for an initial coarse alignment and any of the preceding embodiments are used subsequently (i.e., when coarsely aligned) for fine alignment. Please note that the discussed coarse alignment may also be used for schemes in which a beam of radiation must be aligned with respect to a solid core of a photonic crystal fiber that has a cladding region around core of a solid material.

Figure 15A:
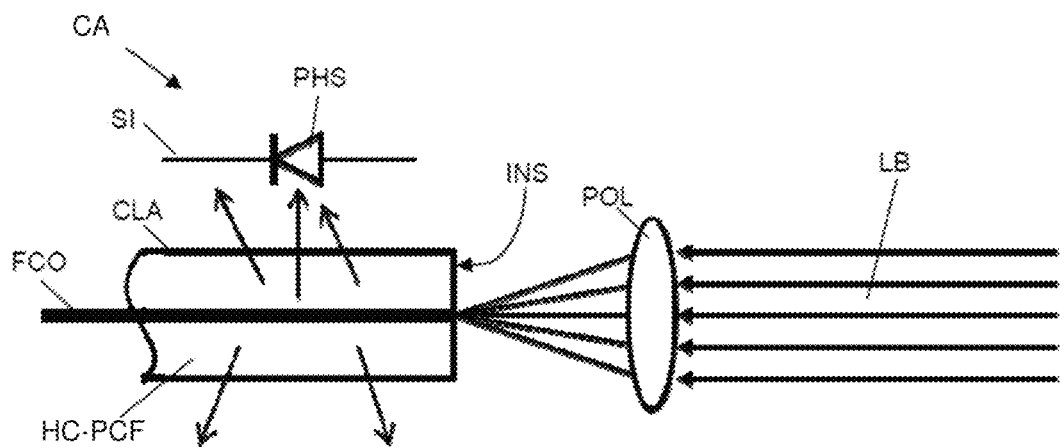
FIGS. 15A, 15B and 15C schematically depict a coarse alignment arrangement according to an embodiment for coarse alignment.

FIG. 15A schematically depicts a coarse alignment arrangement CA according to such an embodiment. The coarse alignment arrangement CA comprises an optical element, in this example a positive lens POL, to focus a radiation beam LB onto an input surface INS of an HC-PCF.

As in the examples of FIG. 7, the HC-PCF has a (hollow) fiber core FCO and an inner cladding waveguide structure (fiber cladding CLA) surrounding the fiber core FCO. The input surface INS delimits one end of the HC-PCF and is configured to receive the radiation beam LB in order to couple at least a part of the radiation beam LB into the fiber core FCO.

It is to be noted that the optical element may be any type of optical element and is not necessarily limited to a positive lens POL. For example, the optical element may be an off-axis parabolic mirror. The coarse alignment arrangement CA further comprises a detector, such as a photosensor PHS, arranged near or on the fiber cladding CLA of the HC-PCF. The photosensor PHS is here embodied as a photodiode, but can be any other type of sensor of radiation or other electromagnetic energy. The photosensor PHS is arranged such that it can receive radiation from the radiation beam LB that is coupled into the fiber cladding CLA at the input surface INS. The photosensor PHS is further configured to output a signal SI that is representative for the amount of radiation received by the photosensor, so that the output signal SI is representative for the amount of radiation coupled into the fiber cladding CLA. Hence, the photosensor measures the radiation scattering out of the fiber cladding CLA that is present due to misalignment of the radiation beam LB and the fiber core FCO. Optionally, there may be an optical filter before the photosensor PHS, to filter unwanted wavelengths/polarizations and/or reduce amount of radiation (e.g., to within the dynamic range of diode).

Figure 15B:
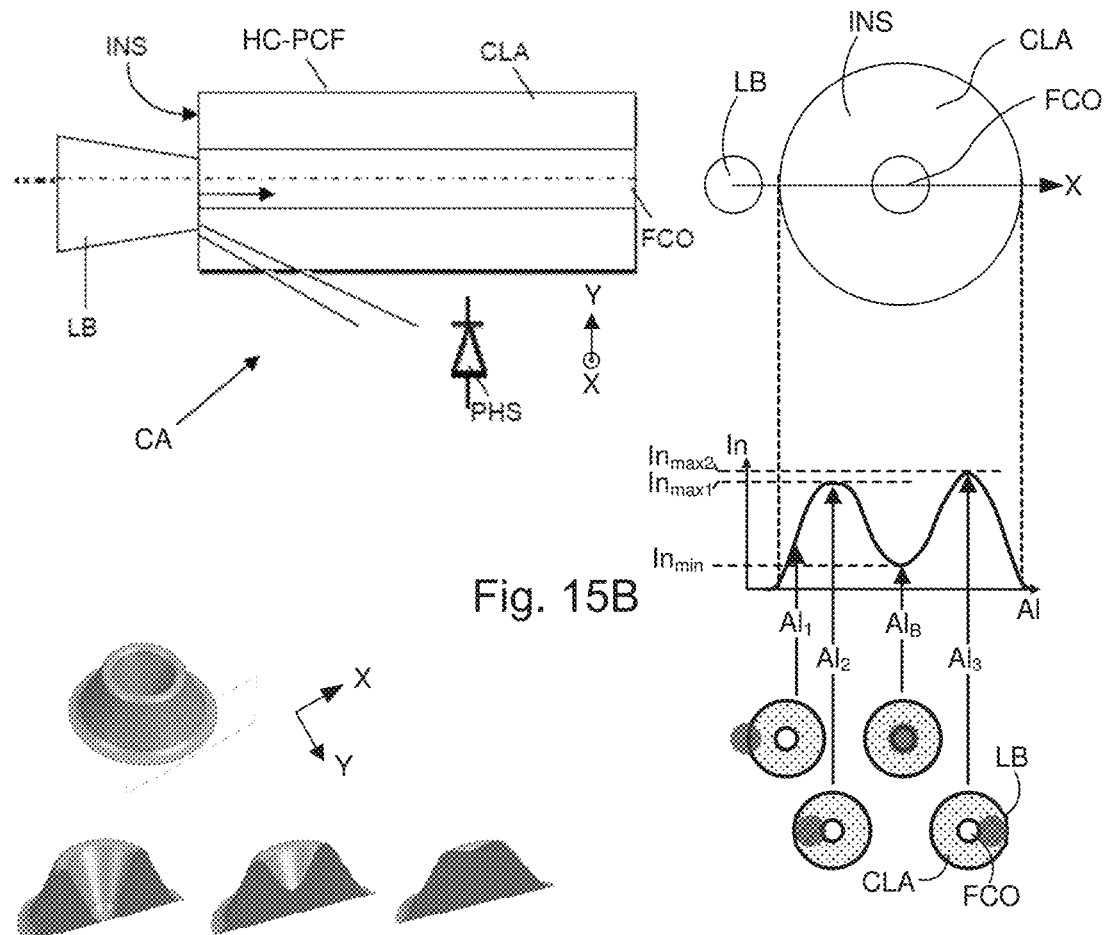

FIG. 15B depicts in more detail the coarse alignment arrangement CA of FIG. 15A by omitting the optical element POL and focusing on the free end of the HC-PCF, where the input surface INS receives the radiation beam LB. In FIG. 15B, it can be clearly seen that the radiation beam LB is not completely aligned with the fiber core FCO and thus a portion of the radiation beam LB is coupled into the fiber core FCO and another portion of the radiation beam LB is coupled into the fiber cladding CLA.

In some systems, measuring the misalignment between radiation beam LB and fiber core FCO can be measured by fiber tapping in which the amount of radiation coupled into the fiber core FCO is measured by altering, e.g. damaging, the HC-PCF to tap a portion of the radiation trapped inside the fiber core FCO and direct this portion to a detector or sensor. However, this leads to transmission loss and may cause a spectral change and/or a change of the polarization extinction ratio.

In this embodiment, it is proposed to measure the radiation coupled into the fiber cladding CLA rather than the radiation coupled into the fiber core. On the right of FIG. 15B, the input surface INS is shown with the radiation beam LB on the left of the HC-PCF. Below the HC-PCF a diagram is shown depicting the output signal In when the radiation beam LB is moved in the X-direction from the left side of the HC-PCF to the right side of the HC-PCF, but it is noted here that similar diagrams can be obtained by moving in other degrees of freedom. The radiation beam LB is shown to begin incident mostly outside of the fiber cladding CLA, corresponding to alignment position $AL_1$ (a specific illustration of the respective arrangement of radiation beam LB, fiber core FCO and fiber cladding CLA is shown directly below each value). At alignment position $Al_2$, the radiation beam LB is mostly incident on the fiber cladding CLA resulting in an increase in the value of the output signal In. Subsequently the radiation beam LB will be incident to the fiber core FCO resulting in a decrease in the value of the output signal In; this corresponds to the best alignment position ALB. Finally, the radiation beam LB will be incident on the fiber cladding CLA again resulting in an increase in the value of the output signal In at alignment position $AL_3$. Hence, the best alignment between radiation beam LB and fiber core FCO is obtained when the output signal In is at a minimum value $In_{min}$ in between a first maximum value $In_{max1}$ and the second maximum value $In_{max2}$ when the radiation beam LB is maximally coupled into the fiber cladding CLA.

It is noted here that the minimum value $In_{min}$ is not necessarily a zero value. A non-zero value for the minimum value $In_{min}$ may very well be possible or even likely, particularly for a coarse alignment stage, e.g., as in practice there may always be a certain level of radiation scattering from the core. The signal $In_{min}$ may also be used during operation of the broadband radiation source to monitor a health of the system and/or of the alignment and/or of the fiber.

Figure 15C:
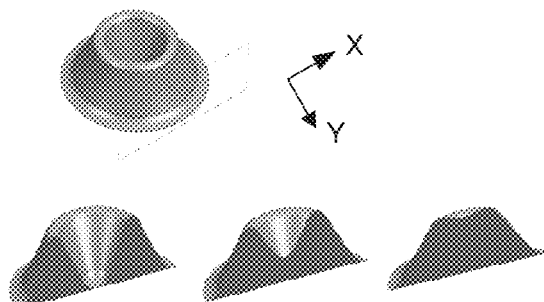

It should also be appreciated that any scan will in fact be a 2 dimensional scan over the input surface INS. As such, the model will be a three dimensional model as illustrated in FIG. 15C, which shows a three dimensional model similar to the 2 dimensional plot of FIG. 15B, and three different offset cross-sections thereof (here the maxima are shown as equal in all directions, although this may not be the case, as shown in FIG. 15B). The scanning algorithm will therefore aim to find the position corresponding to a common minimum between maxima in all directions on the X/Y plane.

The coarse alignment strategy may operate in a feedback loop based on the measured output signal and a control signal for a controller which controls the position of the beam with respect to the input facet of the HC-PCF, so as to find this minimum value $In_{min}$. Such a method may use a search algorithm which searches automatically whether the input beam is aligned sufficiently with respect to the input of the hollow HC-PCF. Such a method may comprise a spiral scan to find a region bounded by maximum values (e.g., forming an annular region), and finding the minimum within this region.

Figure 16:
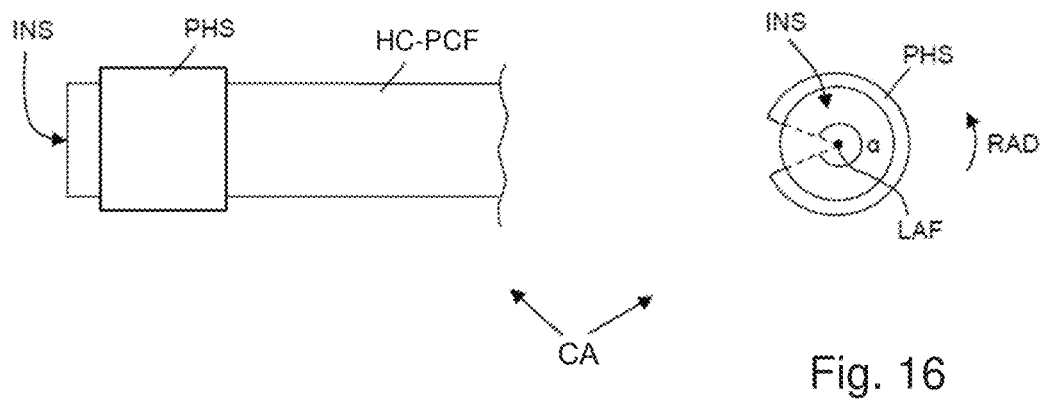
FIG. 16 schematically depicts a coarse alignment arrangement according to an embodiment for coarse alignment.

FIG. 16 schematically depicts a further coarse alignment arrangement CA. FIG. 16 shows respectively, on the left, a side view and, on the right, a front view of an HC-PCF and a photosensor PHS (or other detector) arranged around the HC-PCF. The HC-PCF comprises a hollow fiber core and a fiber cladding surrounding the fiber core as depicted in other figures, but not shown here explicitly. The HC-PCF further comprises an input surface INS configured at one end of the HC-PCF to receive a radiation beam in order to couple at least a part of the radiation beam into the fiber core. The photosensor PHS is arranged to receive radiation from the radiation beam being coupled into the fiber cladding at the input surface INS, wherein the photosensor is configured to output a signal that is representative for the amount of radiation received by the photosensor.

The photosensor PHS may have multiple separate areas that are capable of detecting the amount of radiation that falls on the individual multiple separate areas. If such a photosensor PHS with multiple separate areas is arranged around the HC-PCF information may be obtained with respect to the direction in which a specific amount of radiation is outputted from the fiber cladding. This directional information may be used to steer an alignment of the radiation beam into a direction that depends on the detected directional information.

In the embodiment of FIG. 16, the photosensor PHS is arranged on the fiber cladding near the input surface INS. The photosensor PHS extends in radial direction RAD of the HC-PCF about a longitudinal axis LAF of the HC-PCF over and angle α, which in this case is larger than 180 degrees, even larger than 270 degrees, and almost is 360 degrees. Such an embodiment may advantageously be used to increase the signal-to-noise ratio as for an increased angle α more radiation is received by the photosensor PHS.

Figure 17:
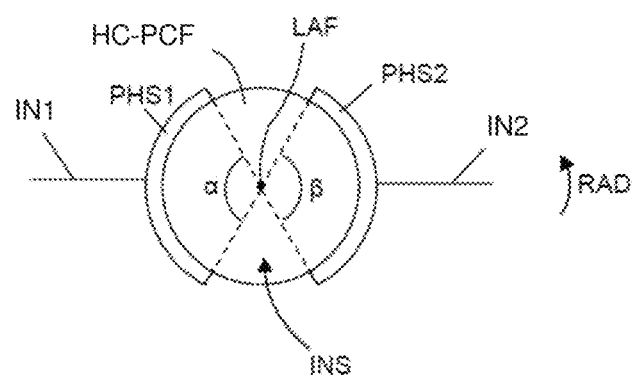
FIG. 17 schematically depicts a coarse alignment arrangement according to an embodiment for coarse alignment.

FIG. 17 schematically depicts a further coarse alignment arrangement CA. The coarse alignment arrangement of FIG. 17 is similar to that of FIG. 16 and only the front view is depicted here to explain the main difference between the two embodiments. The main difference is that in the embodiment of FIG. 16, the coarse alignment arrangement CA comprises two photosensors, namely a first photosensor PHS1 and a second photosensor PHS2, each having the same function. The first and second photosensor PHS1, PHS2 are provided distributed substantially evenly as seen in a radial direction RAD along the periphery (e.g., circumference) of the HC-PCF, wherein each photosensor extends in the radial direction RAD of the HC-PCF about a longitudinal axis LAF of the HC-PCF over an angle α and β, respectively, which angles are smaller than 180 degrees, but desirably larger than 90 degrees.

The first photosensor PHS1 provides a first output signal In1 and the second photosensor PHS2 provides a second output signal In2. A combination of the signals In1 and In2 can be used in a similar manner as the output signal In of the photosensor PHS of the embodiment of FIGS. 15 and 16. However, an advantage of this arrangement is that a control unit receiving both signals In1 and In2 can also determine a linear, or weighted, difference of the signals In1 and In2, which can be used to determine in which direction the radiation beam needs to be displaced or tilted to align the radiation beam with the fiber core.

Although not shown, it can be envisaged that in an embodiment, three or more photosensors may be provided and distributed substantially radially evenly along the periphery of the optical fiber, wherein each photosensor extends in radial direction of the optical fiber about a longitudinal axis of the optical fiber over an angle smaller than 360/n degrees, where n is the amount of photosensors, for example an angle smaller than 120 degrees in case of three photosensors.

In a variation of the arrangement depicted in FIG. 17, the second photosensor PHS2 may be replaced by a mirror element used in combination with only a single photosensor PHS1. The mirror element reflects radiation coupled into the fiber cladding at the input surface towards the photosensor PHS1. As a result thereof the signal-to-noise ratio may be improved. The mirror element is not necessarily arranged on the fiber, but may be arranged around the fiber at a distance thereof instead. The mirror element may also be accompanied by one or more other mirror elements all configured to reflect radiation coupled into the fiber cladding towards the photosensor PHS1.

An advantage of this coarse alignment arrangement is that radiation can be coupled into the core of the optical fiber after misalignment, e.g. due to replacing of components or drift, which coupling can be done inline without having to change or disconnect the system.

Figure 18:
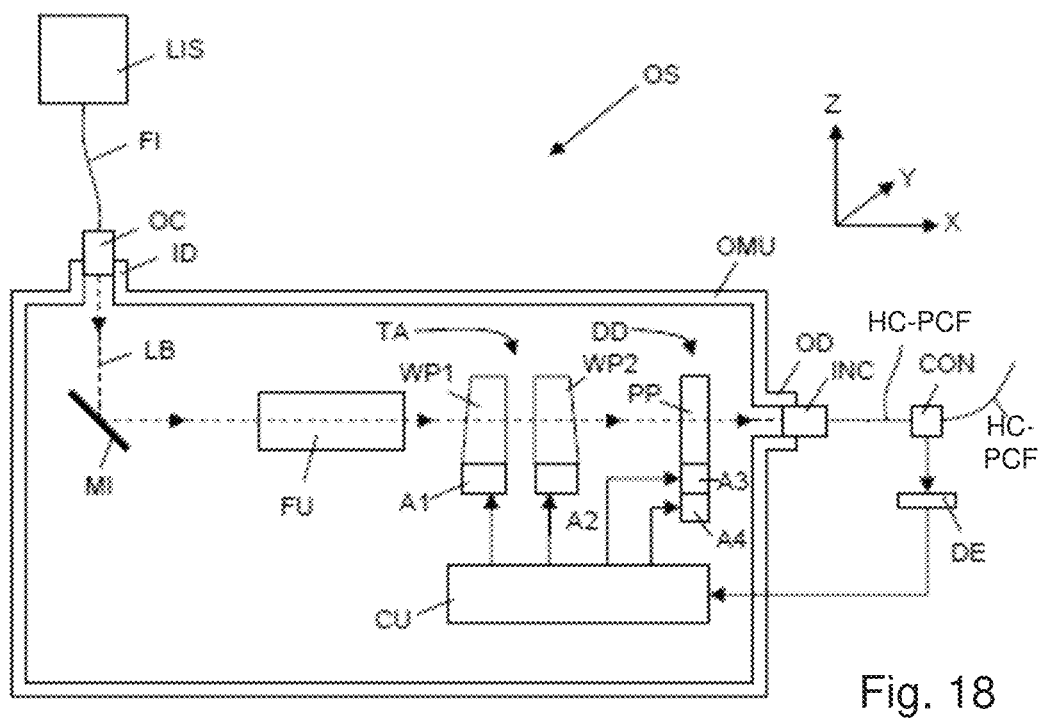
FIG. 18 schematically depicts a specific optical manipulation unit according usable in at least the coarse alignment arrangement depicted in FIGS. 15 to 17.

FIG. 18 schematically depicts an optical system OS with a specific beam steering arrangement or optical manipulation unit OMU usable for actual control of the beam on the input face in a coarse alignment arrangement and/or in any of the fine alignment embodiments as disclosed herein.

The optical system OS comprises a radiation source LIS and an optical manipulation unit OMU. The radiation source LIS provides a radiation beam LB to the optical manipulation unit OMU using a fiber FI and an output connector OC, which output connector OC may comprise a collimator to provide a collimated radiation beam LB to the optical manipulation unit OMU. The radiation source LIS may be a white light source or a supercontinuum source.

The optical manipulation unit OMU comprises an input device ID configured to receive the output connector OC. It will be appreciated that the input device ID and the output connector OC have been depicted highly schematic, but that both components may comprise features allowing the output connector OC to be releasably, but rigidly connected to the input device ID, allowing to replace the output connector OC or to disconnect the output connector OC and subsequently connect the output connector OC again.

The optical manipulation unit OMU further comprises one or more optical elements configured to manipulate the radiation beam LB. Depicted as an example of such optical elements in FIG. 18 are a mirror MI directing the radiation beam to a filter unit FU configured to filter the radiation beam passing the filter unit FU. Filtering may comprise spectral filtering, polarizing filtering and/or overall attenuation of the radiation beam.

It is mentioned here that the presence of a filter unit does not mean that other optical elements may not have a filtering function as well, e.g. in the form of a reflective or transmissive band pass filter. Hence, the mirror MI may have such alternative or additional filtering function.

In this embodiment, downstream of the filter unit FU a radiation beam tilt adjuster TA is provided to adjust a propagation direction of the radiation beam LB. The radiation beam tilt adjuster TA comprises a first wedge prism WP1 and a second wedge prism WP2 arranged in series, wherein each wedge prism WP1, WP2 comprises a respective tilt actuator A1, A2 to rotate the corresponding wedge prism WP1, WP2 about its respective optical axis, which in FIG. 18 extends mainly in the X-direction. The tilt actuators A1, A2 are part of a tilt actuation system.

In this embodiment, arranged downstream of the radiation beam tilt adjuster TA, a radiation beam displacement device DD is provided to displace the radiation beam LB. The radiation beam displacement device DD comprises a planeparallel plate PP and a displacement actuation system to rotate the plane-parallel plate PP about a first axis using actuator A3 and a second axis using actuator A4, which first and second axes are substantially perpendicular to each other and to the propagation direction of the radiation beam. The first axis may for instance be substantially parallel to the Y-direction and the second axis may for instance be substantially parallel to the Z-direction as the propagation direction of the radiation beam LB is substantially in the X-direction.

The optical manipulation unit OMU further comprises a control unit CU connected to the tilt actuation system (A1, A2) and the displacement actuation system (A3, A4) in order to adjust the propagation direction of the radiation beam and to displace the radiation beam in order to direct the radiation beam LB towards an input connector INC. The input connector INC is received in an output device OD of the optical manipulation unit OMU and may comprise a coupling device to couple radiation into fiber HC-PCF. Similarly to the input device ID and the output connector OC, the output device OD and the input connector INC are depicted highly schematically here and thus may comprise features allowing them to rigidly, and possibly releasably, connect to each other, allowing the input connector INC to be replaced by a new or different input connector INC or to be disconnected and connected again, e.g. for maintenance.

The fiber HC-PCF may, as in this example, comprise a first fiber portion and a second fiber portion connected to each other using a connector CON. The connector CON or the fiber HC-PCF may be configured to direct a portion, desirably a small portion of the radiation, passing the connector CON to a detector DE to determine a radiation intensity of the radiation beam in the fiber HC-PCF which radiation intensity is a measure for the amount of radiation that is coupled into the fiber by the coupling device of the input connector INC. Hence, the determined radiation intensity of the radiation beam in the fiber HC-PCF can be used to operate the control unit CU to control the tilt actuation system until the radiation beam is received by the input connector INC.

In an embodiment, the control unit CU may be configured to control the tilt actuation system such that the radiation beam is moved along a spiral pattern, in this case in the Z-Y plane, in order to find a first estimate of a desired propagation direction of the radiation beam to be received by the input connector INC and subsequently the tilt actuation system and/or the displacement actuation system is controlled to move the manipulated radiation beam around the first estimate in order to find an improved first estimate of the desired propagation direction and/or displacement of the radiation beam. Moving the radiation beam in a spiral pattern may be accomplished by rotating the two wedge prisms WP1, WP2 at different angular velocities. The first and second estimates may both be coarse alignment estimates, with the fine alignment strategies otherwise disclosed herein applied for fine alignment. Alternatively, the first estimate may relate to the coarse alignment and the second estimate may relate to the final alignment. In the latter example, the fine alignment may rely on one of the other measurement strategies described herein.

In accordance with an embodiment, there is provided a timing control system configured for controlling timing of pump laser pulses and/or broadband output pulses of a HC-PCF based broadband radiation source. Timing control of laser pulses is often desirable in applications where precise temporal location of laser pulses with respect to a timing reference is desired and is typically achieved using for example micro-processor or micro-controller based technologies. A typical timing control system may comprise one or more micro-processors, a central processing unit (CPU), and a memory unit. When such a micro-processor based timing control system is used for controlling timing of a HC-PCF based broadband radiation source, timing of the pump laser pulse, the broadband output pulse and the generated signals from one or more optical clients, e.g., optical sensors, can be determined and/or synchronized. However, using prior timing control systems to control timing of HC-PCF based broadband radiation sources may have many technical challenges or drawbacks. First, a HC-PCF based radiation source comprises multiple components which are often located far apart from each other. For example, the pump laser, typically comprising a seed laser, a pre-amplifier, a pulse stretcher, a power booster and a pulse compressor, is connected to a supercontinuum fiber which could be located more than 10 meters away. Communications between such components, e.g., between a seed laser and a supercontinuum fiber, can cause non-negligible time delay. Further, the timing of the pump laser is complex due to its complex optical architecture (e.g., an optical system comprising a seed laser, a pre-amplifier, a pulse stretcher, a power booster and a pulse compressor). Consequently, each component of the pump laser will have an impact on the timing of the pump laser pulse. The timing of the broadband output pulse is also complex due to the intra-pulse group delay dispersion resulting in different wavelengths having different timings. Those complex timings impose stringent requirements on the performance (e.g., timing accuracy) of the timing control systems and are typically fulfilled with a complex control architecture. Furthermore, the generated signal from each of the optical clients, e.g., optical sensors, needs to be processed before being usable by other control units for other components. To fulfil this requirement, prior timing control systems are often equipped with signal processing functionality, thereby resulting in an even more complex control architecture.

The above-mentioned drawbacks may result in difficulties in accurate prediction and/or modelling of the time delay between any two components, e.g., the seed laser and one of the optical clients for monitoring the supercontinuum output. Although the time delay determined by the timing control system could be calibrated against measurement data such that timing error can be corrected, this approach, however, is not practical for HC-PCF based radiation sources as their laser pulses are too short to be accurately measured. To obtain the best possible timing performance, extensive control firmware and/or software configured to operate within predefined margins is typically required. The extensive control firmware and/or software together with the complex micro-processor based hardware makes the whole timing control system overly complex and expensive. Since a firmware or software based control system is more prone to errors, it takes a large time and effort to make it robust.

In accordance with an aspect of the present disclosure, embodiments described below provide better solutions to one or more of the aforementioned, or other, problems. A significant advantage of one or more of the following embodiments over prior timing control systems is that the use of micro-processors or similar technologies can be prevented.

Figure 19:
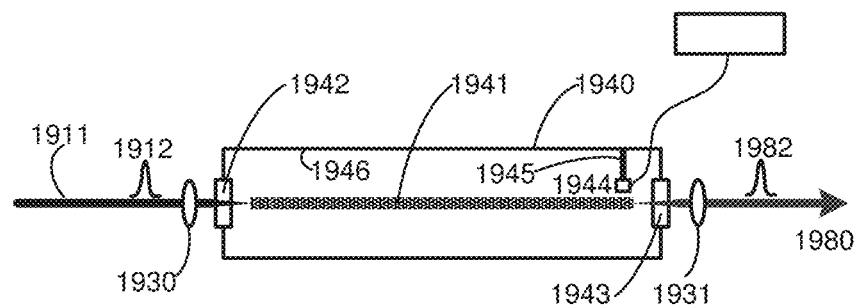
FIG. 19 schematically depicts a broadband radiation source equipped with a specific timing control system, in accordance with an embodiment, for control and determination of timing of pulses of the broadband radiation source.

FIG. 19 schematically illustrates a timing control system configured for timing control of a HC-PCF based broadband radiation source, in accordance with an embodiment. With reference to FIG. 19, the timing control system may comprise a pressure sensor 1944 (e.g., a very high speed pressure sensor) configured to detect or monitor pressure change of the gas cell 1940. In this embodiment, the pressure sensor 1944 may be held in the vicinity of the output end of the HC-PCF 1941 by a supporting structure 1945 which is connected to the inner side of the gas cell wall 1946. In some embodiments, the pressure sensor 1944 may be mounted directly on the inner side of the gas cell wall 1946. The gas sensor 1944 may communicate with one or more external devices via one or more signal cables which either pass through the gas cell wall 1946 in a sealed manner or connect to one or more external cables via one or more feedthrough connectors.

With continued reference to FIG. 19, the pump laser beam 1911 comprising a train of pump laser pulses 1912 is focused by a focusing lens 1930. The focused pump laser beam 1911 passes through an input window 1942 of the gas cell 1940 before coupling into the core of the HC-PCF 1941. While propagating along the fiber, each pump laser pulse 1912 is spectrally broadened to a broadband output pulse 1982 via one or more aforementioned nonlinear optical processes. After leaving the gas cell 1940, the broadband output beam 1980 comprising a train of broadband output pulses 1982 is collimated by a collimation lens 1931. From the onset of the one or more nonlinear processes, the spectral bandwidth of the pump laser pulse 1912 continues to increase (e.g., spectral broadening) until the spectrally broadened pulse exits the fiber. Once leaving the fiber, the broadband output pulse 1982 may travel a short distance inside the gas cell 1940 before exiting the output window 1943 of the gas cell 1940. When entering into the gas cell 1940, the broadband output pulse 1982 generates a pressure wave inside the gas cell 1940. The amplitude of such a pressure wave can be affected by many factors, such as the operating conditions of the gas cell 1940 (e.g., gas cell pressure, gas type, etc.) and laser parameters of the broadband output pulse 1982 (e.g., pulse energy, pulse spectrum, pulse width, etc.). The pressure wave (temporally) alters the internal pressure distribution of the gas cell 1940. The resultant pressure change at the location of the pressure sensor 1944 is detected by the pressure sensor and is subsequently converted by the pressure sensor 1944 to an electrical signal. In some embodiments, the electrical signal may be used as an output pulse trigger signal which indicates the timing of a broadband output pulse 1982 being generated. Additionally or alternatively, such an electrical signal may be sent to the processing unit 1060, 1160, 1260, 1360, 1460 and/or control unit 1070, 1170, 1270, 1370, 1470 of the broadband radiation source such that different functionalities can be realized, for example, outputting a burst of broadband pulses.

Note that a pressure wave is also generated when the pump laser pulse is admitted into the gas cell 1940 before coupling into the HC-PCF 1941. Therefore, in some embodiments, timing of the pump laser pulse 1911 entering into the gas cell 1940 may also be determined using the same pressure sensor 1944 and/or an additional pressure sensor (not shown) e.g., located in the vicinity of input window 1942.

In conjunction with the timing of the broadband output pulse 1982, a relative time delay between the pump laser pulse 1911 and the broadband output pulse 1982 may be determined. Note that since the broadband output pulse 1982 is intrinsically synchronous (in a fixed time relation) with the pump laser pulse 1911, the electrical signal of the broadband output pulse 1982 is therefore also synchronous with the electrical signal of the pump laser pulse 1911. The two pulse trains, i.e. the pump laser pulse train and the broadband output pulse train, are offset in time by an amount of the aforementioned time delay. In some embodiments, the timing control system may further comprise an adjustable optical delay line configured to adjust or minimize the time delay between the two pulse trains.

It can be appreciated that the methods described above in relation to FIG. 19 may be used independently of or in combination with any of the other embodiments disclosed herein. Where used in combination, the mode purity based embodiments may be used for an initial alignment (coarse and/or fine) and any of the preceding embodiments used subsequently (i.e., when the radiation source is properly aligned) for timing control.

For some metrology or inspection tools such as the aforementioned scatterometry based metrology tools, the performance of a metrology tool can be strongly affected by one or more polarization properties of the illumination radiation of the tool. Such one or polarization properties may include polarization extinction ratio (PER) or polarization quality, polarization stability, orientation of predominantly linearly polarized radiation, etc. The PER is defined as the power ratio of two perpendicular polarizations which are often called transverse electric (TE) and transverse magnetic (TM) and is typically used to characterize how good a linear polarization is. The polarization stability is used to characterize how stable a polarization state can be maintained over time. Due to component aging and/or movement, the polarization of the illumination radiation would change over time, resulting in rotation of polarization and/or PER degradation. If an illumination beam with a poor PER is used in a polarization sensitive metrology tool, e.g., a scatterometer, the optical power in the unwanted polarization direction will not contribute to the measurement and can even cause background scattering, thereby reducing the detection signal-to-noise ratio (SNR). Moreover, since only the optical power in the desired polarization direction is used for measurement, the power efficiency of the metrology tool is low. Similarly, if an illumination beam with an unstable polarization is used in e.g., a scatterometer, variations in the received polarization typically result in power fluctuations at substrate level, impairing the fidelity of the metrology tool. Therefore, it is desirable to use an illumination source which is able to provide a good polarization stability.

When HC-PCF based broadband radiation sources such as those described in FIGS. 10 to 14 are used as the illumination source in e.g., a scatterometer, a linearly polarized broadband output beam with a good PER is desirable. Since the broadband output beam inherits polarization properties predominantly from the pump laser beam, a linearly polarized pump laser beam with a good PER may be used. For a perfectly made and straight HC-PCF, mounted without stress, the PER of the broadband output beam is expected not to depend on the input (pump) polarization direction. However, when coupling a low pump power through a HC-PCF (i.e. no spectral broadening occurs in the HC-PCF), the PER of the transmitted pump laser beam can periodically vary with the input (pump) polarization direction. This is explained by the fact that slight asymmetries in the HC-PCF will result in a small optical birefringence, thereby making the fiber effectively a long polarization retarder (or waveplate) with a fast axis and a slow axis. The slight asymmetries in the HC-PCF could be due to fabrication tolerances and/or mounting induced fiber stress. Fabrication tolerances can result in fluctuations in the structural core width (e.g., diameter) of HC-PCF, thereby effectively making the core slightly, e.g., elliptical. Consequently, orthogonal input polarizations may see different modal indices (i.e. forming a fast and a slow axis) and experience different attenuation. When the polarization direction of the pump laser beam matches with either the fast or slow axis of the fiber, the polarization fidelity of the pump beam is maintained. However, where there exists a mismatch between the polarization direction of the pump laser beam and the fast or slow axis of the fiber, the PER of the transmitted pump laser beam will be degraded.

Therefore, to obtain a linearly polarized broadband output beam with a high PER, it is desirable to accurately align the polarization direction of the pump laser beam with a desired birefringence axis of the fiber. For an industrialized laser product, the polarization direction of the pump laser beam is fully optimized during the factory build. The control/optimization of the polarization direction of the pump laser beam is typically achieved at low power levels and using a polarization controlling device, e.g., a half-wave plate (HWP), which can be located in the beam path of the pump laser beam before the in-coupling in the HC-PCF. While the polarization direction of the pump laser beam is rotated by the HWP, the PER of the pump laser beam after propagating through the fiber is measured with a polarimeter. However, whenever a key component (e.g., gas cell or HC-PCF) is replaced e.g., for the purpose of maintenance or repair, the polarization direction of the pump laser beam with respect to the desired fiber axis needs to be re-optimized. This means a polarimeter will be used to characterize and confirm the laser PER during and after re-optimization. In addition, custom-designed tooling may also be used to access and/or control certain component(s), e.g., the HWP in the packaged laser product. Although it could be possible to pre-characterize the axis orientation of the HC-PCF and use such information to align the absolute rotation of the fiber, any change of the pump polarization can still lead to degradation of output PER. Hence, a polarimeter will still be used, e.g., as a permanent in-product diagnostic, to monitor the stability of the pump polarization which is manifested by the PER of the transmitted pump laser beam. A polarimeter is an expensive and bulky diagnostic device. To equip each HC-PCF based broadband laser source with a polarimeter increases the cost and imposes limitation on the footprint of the laser product.

In accordance with an aspect of the present disclosure, a method is proposed to solve one or more of the aforementioned, or other, problems. The proposed method is based on the finding that, when a linearly polarized beam of radiation propagates through a waveguide structure having an asymmetric modal index profile, e.g., for example a fiber having a (slightly) elliptical cross-section, the PER of the output beam and the output power are strongly correlated. Therefore, it is possible to use the power measured at the fiber output to indirectly evaluate or infer how well the polarization of the pump laser beam is aligned with a desired axis of the fiber. If the relation between the angular offset between the polarization direction of the pump beam and the desired fiber axis, and the power at the fiber output is known, it is also possible to use the power measured at the fiber output to determine the angular offset between the polarization direction of the pump beam and the desired fiber axis at the fiber input. Since power measuring devices are the most common diagnostic equipment and much less expensive than polarimeters, the method is thus advantageous over the prior methods as it can obviate the need of a polarimeter.

The correlation of output power with PER may be explained by a structural feature of the HC-PCF, the modal index, and attenuation of the fundamental guided mode $(LP_{01})$ can be approximated by:

$$n_{01} = \sqrt{1 - \left(\frac{u_{01}}{\pi} \times \frac{\lambda}{D}\right)^2} \text{ and } \alpha_{01} \sim \frac{\lambda^3}{D^4}$$

where $u_{01}$ is the $1^{st}$ zero of the Bessel function of first kind $J_0$, $\lambda$ is the wavelength and D the inscribed core diameter. As such, mode purity may also be monitored in this manner.

Figure 20:
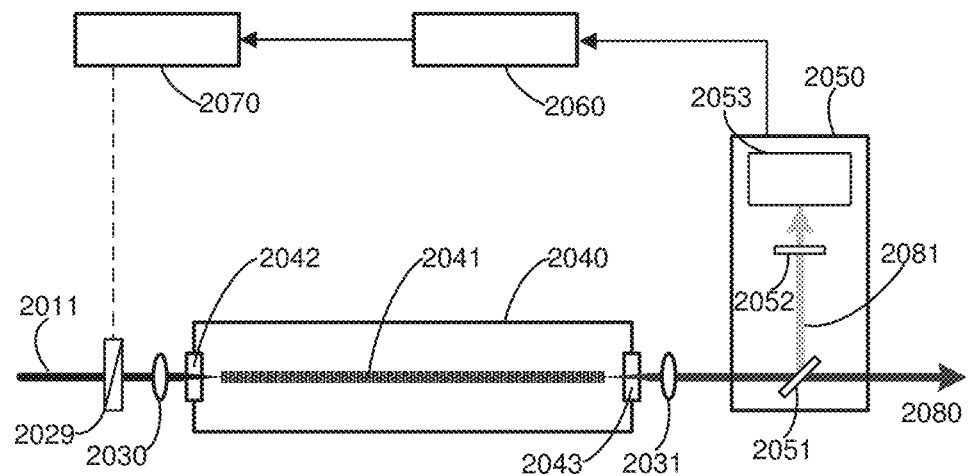
FIG. 20 schematically depicts a broadband radiation source equipped with a specific polarization control system, in accordance with an embodiment, for optimization and stabilization of output polarization of the broadband radiation source.

FIG. 20 schematically illustrates a polarization control system configured for polarization control of a HC-PCF based broadband radiation source, in accordance with an embodiment. With reference to FIG. 20, the polarization control system may comprise an HWP 2029 for control of the polarization of the pump laser beam 2011. The HWP 2029 may be placed anywhere between the pump laser 2010 and the input window 2042 of the gas cell 2040. In the case where a pump focusing lens 2030 is used to focus the pump laser beam 2011 into the core of the HC-PCF 2041, it is desirable to place the HWP 2029 before the focusing lens 2030 as this could avoid the HWP 2029 being potentially damaged by the focused laser beam with a higher peak intensity.

In an embodiment, the polarization control system may further comprise a beam splitter 2051 placed on the beam path of the output beam 2080, desirably after the collimation lens 2031 to avoid potential damage. The beam splitter 2051 may split part of the output beam 2080 and may reflect it into a detection unit 2050 for diagnostic purposes. The part of the output beam 2080 reflected off the beam splitter 2051 may be labelled as a reference beam 2081. The detection unit 2050 may comprise a power measuring device 2053 such as a power meter that measures the power of the reference beam 2081. Before being received by the power measuring device 2053, the reference beam 2081 may pass through one or more optical filters 2052 that are used to select a desired range of wavelengths from the spectrum of the reference beam 2081. Note that the beam splitter 2051 impacts negligibly on the optical characteristics of the reference beam 2081 other than imposing a power splitting ratio to the output beam 2080.

In some embodiments, the polarization control system may be operated in a high power or energy regime where the pump laser power/energy is high and the pump pulse will experience significant spectral broadening after traversing the fiber. In some other embodiments, the polarization control system may be operated in a low power/energy regime where the pump laser power/energy is low and the pump pulse will not undergo spectral broadening while traversing the fiber. When operated in the low power regime, the output beam 2080 has substantially the same optical spectrum as that of the pump laser beam. Since the pump laser beam typically has a narrowband spectrum, spectral filtering may not be necessary and thus one or more optical filters 2052 may not be used. In contrast, when operated in the high power regime, the output beam 2080 has a broadband optical spectrum, significantly broader than that of the pump laser beam. In this case, spectral filtering may be required to only measure the power in a desired spectral range and therefore one or more optical filters 2052 may be used. In some embodiments, the beam splitter 2051 may be removed and the detection unit 2050 may be placed on the beam path of the output beam 2080 such that the full output beam 2080 is received by the power measuring device 2053.

With continued reference to FIG. 20, the polarization control system may further comprise a processing unit 2060 and a control unit 2070. The power measuring device 2053 measures the power of the reference beam 2081 and subsequently generates a power signal. The generated power signal may be sent to the processing unit 2060 which processes the received power signal (e.g., in a pre-defined manner). Then, the processed power signal may be sent to the control unit 2070 which, based on the processed power signal, generates a corresponding control signal. The control unit 2070 may comprise a memory unit for storage of the processed data. Finally, the control signal may be used to make suitable adjustment to the HWP 2029. Note that the processing unit 2060 and the control unit 2070 do not have to be separate units but instead can be integrated into one processing and control unit (not shown) which performs all the tasks performed by the processing unit 2060 and the control unit 2070.

As mentioned above, the polarization control system can be used to optimize the polarization direction of the pump laser beam with respect to a desired axis of the HC-PCF in at least two scenarios, e.g., component replacement and long term polarization stability. The polarization control system may be operated in two different routines. In the scenario where a key component is replaced, e.g., a gas cell 2040, the polarization direction of the pump laser beam 2011 should be re-optimized so as to match a desired axis of the new fiber 2041. In some embodiments, this may be achieved by rotating the HWP 2029 by one full turn or 360°. In other embodiments, the HWP 2029 may be rotated by more than 360°, such as 540°, 720°, 900° or 1080°. In some embodiments, the HWP 2029 may be mounted on e.g., a motorized rotational mount which rotates the HWP 2029 in small increments. Depending on the resolution requirement, each incremental step may correspond to a small rotation angle, such as 1° per step, 2° per step, 5° per step or 10° per step.

With reference to FIG. 20, during the optimization process, the control unit 2070 sends a control signal to the HWP 2029 so as to command it to conduct a rotation task, e.g., to incrementally rotate 360° with a step size of 5° (or 72 steps). After each rotation step, the power of the reference beam 2081 is measured by the power measuring device, e.g., a power meter. The power signal generated by the power measuring device 2053 is processed by the processing unit 2060, e.g., by averaging and/or filtering. The processed power signal may be sent to the control unit 2070 where the power value is saved against the current angular position of the HWP 2029 e.g., in a memory unit. At the end of the rotation task, i.e. a rotation of 360° with a step size of 5°, a table of data with 72 pairs of power and angle values will be generated and stored. Based on the data, the relation between the power of the output beam 2080 (or the reference beam 2081) and the angular position of the HWP 2029 can be determined via, e.g., interpolation of the data. By reference to an existing PER-power correlation curve, which indicates that each power minimal corresponds to a PER maximal, the power-angle relation can be converted to a PER-angle relation from which the optimal HWP position that is able to give a maximum PER (or a minimum power) can be determined.

In the scenario where long term PER stability is to be monitored and/or maintained, the power of the output beam 2080 or the reference beam 2081 may be either continuously or intermittently measured/sampled by the power measuring device 2053. Note that it is assumed that the power-angle relation of the broadband radiation source is already available before the long term PER stability can be monitored and/or maintained. The power signal generated by the power measuring device 2053 may be processed, e.g., averaged over a number of sampling points, by the processing unit 2060 before being sent to the control unit 2070. Upon receiving the processed power signal, the control unit 2070 may compare the processed power signal with a pre-defined power threshold. If the power signal is higher than the power threshold, the control unit 2070 may not generate any control signal. However, if the power signal is lower than the power threshold, a control signal is generated. The control signal may command the HWP 2029 to make a corresponding rotation task. In some embodiments, the rotation task may comprise a full 360° rotation of the HWP such as the example described above. Alternatively, in other embodiments, the rotation task may comprise a small angle rotation around the current angular position of the HWP 2029. A new angular position of the HWP 2029 may be determined when the PER (manifested by the measured power) of the output beam 2080 or the reference beam 2081 is optimized. The control unit 2070 may then update the set angular position with the new angular position in the memory (if available). Following that, the polarization control system continue to monitor the long term PER stability.

As the power of the output beam 2080 or the reference beam 2081 may be indicative of mode purity, the methods of this section may be used in the mode control systems described herein.

Note that the number, location and type of the power measuring device 2053 are not restricted to what have been described. In some embodiments, a 'miniature' power measuring device may be placed in the vicinity of the output end of the HC-PCF fiber such that the power of the scattered radiation at the fiber tip can be measured. Since the power of the scattered radiation at the fiber tip is linearly proportional to the power of the broadband output beam, the above-described method for PER optimization still holds valid. In some embodiments, the miniature device may comprise a multiple mode fiber and a power meter. One or both of gas cell 2040 or HC-PCF 2041 may be mounted on a motorized rotation stage and the HWP 2029 may have a fixed angular position. In such a manner, instead of, or in addition to, rotating the HWP 2029 for PER optimization, the gas cell 2040 or the HC-PCF 2041 or both may be rotated to minimize the angular difference between the pump polarization direction and one axis of the fiber and thus maximize the PER of the output beam 2080.

It can be appreciated that the method of any of the foregoing embodiments may be used independently of or in combination with any of the other embodiments disclosed above, in the latter case as part of the mode control system and/or such that any of the foregoing embodiment is used for an initial alignment (coarse and/or fine). Additionally or alternatively the other embodiments may be used subsequently (i.e., when the radiation source is properly aligned) for subsequent polarization optimization. When used independently, the above-described embodiments is not restricted to be applied to HC-PCF based broadband radiation source but can be used to determine and/or optimize a relative angle between the polarization direction of a pump laser beam and an optical plane of a nominally cylindrically shaped waveguide.

It should be noted that the configuration of HC-PCF based broadband radiation sources is not restricted to the specific arrangements illustrated or described, and different configurations may be implemented. For example, the pump laser 1010, 1110, 1210, 1310, 1410 may be configured to output a convergent pump laser beam, instead of a collimated pump laser beam 1011, 1111, 1211, 1311, 1411 the waist of which has a good mode matching with the fiber core. In this case, the focusing lens 1030, 1130, 1230, 1330, 1430 is not required. The beam delivery system may differ from the specific example of two or more steering mirrors 1020, 1120, 1220, 1320, 1420, 1021, 1121, 1221, 1321, 1421 illustrated. Alternatively, or in addition, at least one of these mirrors may comprise a curved surface and/or another focusing beam delivery component provided, which has a radius of curvature (ROC) carefully chosen to form a mode-matched pump spot without the use of the focusing lens 1030, 1130, 1230, 1330, 1430. According to an embodiment, the input optical window 1042, 1142, 1242, 1342, 1442 may be replaced by the focusing lens 1030, 1130, 1230, 1330, 1430 and/or the output optical window 1043, 1143, 1243, 1343, 1443 may be replaced by the collimating lens 1031, 1131, 1231, 1331, 1431. In such a configuration, the distances between the two lenses and the two fiber ends are chosen such that mode matching conditions are well maintained. A broadband radiation source configured in this way is more compact but less flexible. In another embodiment, the gas cell 1040, 1140, 1240, 1340, 1440 may consist of multiple sub-cells; and the HC-PCF 1041, 1141, 1241, 1341, 1441 may be partially or completely comprised in the sub-cells. Beamsplitter 1051, 1151, 1251, 1351, 1451 may be located outside of the respective detection unit 1050, 1150, 1250, 1350, 1450 rather than inside as illustrated. The processing unit 1060, 1160, 1260, 1360, 1460 and control unit 1070, 1170, 1270, 1370, 1470 are not necessarily separate entities and may comprise a single unit with single processor to carry out the processing and control functions.

Although any one of the above-mentioned embodiments is sufficient to independently perform mode optimization for a broadband radiation source, some embodiments may be complementary to each other and hence may be combined to improve the overall performance of the mode control system. For example, in an embodiment, the beam shape measuring device 1253 may be added to or combined with the detection unit 1050 (comprising bandpass filter 1052 and a power measuring device 1053). In such a way, the transverse mode profile of the broadband output beam can be directly monitored by the beam measuring device 1253 while an output spectral parameter (e.g., PSD) is measured by the power measuring device 1053. Since the power and/or spectral profile of the broadband radiation source may gradually degrade over time (e.g., caused by aging of pump diodes), the spectral parameter (e.g. PSD) values may change (e.g., drop) correspondingly even though the mode purity remains unchanged. Therefore, the addition of the beam measuring device allows the mode control system to quickly validate whether any changed spectral parameter values are caused by the mode degradation or from component aging induced power degradation and therefore prevent the mode control system from entering an optimization dead-loop if it is the latter. Furthermore, a regular update of reference spectral parameter values is desirable to reflect component aging induced power degradation. The use of the beam measuring device 1053 helps ensure that the reference spectral parameter values can be regularly maintained and updated when the mode purity is optimal.

As such, any of two or more of the detection units 1050, 1150, 1250, 1350, 1450 or components therein may be used in combination, either detecting and evaluating the same reference beam or separate reference beams (e.g., as generated by multiple beamsplitters on the output beam).

Further embodiments are disclosed in the subsequent numbered clauses:

1. A mode control system, being configured for controlling an output mode of a broadband radiation source comprising a photonic crystal fiber (PCF), the mode control system comprising:

at least one detection unit configured to measure one or more parameters of radiation emitted from the broadband radiation source to generate measurement data; and a processing unit configured to evaluate mode purity of the radiation emitted from the broadband radiation source, from the measurement data, wherein, based on the evaluation, the mode control system is configured to generate a control signal for optimization of one or more pump coupling conditions of the broadband radiation source, the one or more pump coupling conditions relating to the coupling of a pump laser beam with respect to a fiber core of the photonic crystal fiber.

2. The mode control system as defined in clause 1, wherein the one or more parameters of the output radiation comprises one or more parameters indicative of mode purity of the broadband radiation source.

3. The mode control system as defined in clause 1 or clause 2, wherein the radiation emitted from the broadband radiation source detected by the detection unit comprises output radiation emitted from an output end of the photonic crystal fiber.

4. The mode control system as defined in clause 3, comprising a beamsplitter located to split a reference beam from a main output beam emitted by the photonic crystal fiber, the output radiation detected by the detection unit comprising the reference beam.

5. The mode control system as defined in any of clauses 1 to 4, wherein the at least one detection unit comprises a spectrum measuring arrangement operable to measure one or more spectral parameter values of the output radiation as the measurement data.

6. The mode control system as defined in clause 5, wherein the spectral parameter values comprise one or more parameters of a measured spectrum of the output radiation.

7. The mode control system as defined in clause 5 or clause 6, wherein the spectrum measuring arrangement comprises a spectrum measuring device and a multimode optical fiber operable to guide the at least part of the radiation emitted from the broadband radiation source to the spectrum measuring device.

8. The mode control system as defined in any of clauses 1 to 7, wherein the detection unit comprises one or more bandpass filters, each of the one or more bandpass filters operable to select a respective spectral range of the output radiation and an illumination measuring device operable to detect an illumination parameter indicative of power of the filtered radiation, the measurement data comprising and/or being derived from the illumination parameter indicative of power.

9. The mode control system as defined in clause 5 or clause 6, wherein the measurement data comprises a power spectral density or energy spectral density value in one or more spectral ranges, derived from the illumination parameter indicative of power.

10. The mode control system as defined in any of clauses 1 to 9, wherein the detection unit comprises a spatial filter operable to filter out higher order modes other than a fundamental mode from output radiation and an illumination measuring device operable to detect an illumination parameter indicative of power of the filtered radiation, the measurement data comprising and/or being derived from the illumination parameter indicative of power.

11. The mode control system as defined in clause 10, wherein the spatial filter comprises a single mode fiber or a pinhole.

12. The mode control system as defined in any of clauses 1 to 11, further comprising a variable polarization arrangement operable to controllably configure a polarization property of the radiation emitted from the broadband radiation source; wherein the detection unit comprises an illumination measuring device operable to detect an illumination parameter indicative of power of the radiation emitted from the broadband radiation source as a function of the input polarization angle, the measurement data comprising and/or being derived from the illumination parameter indicative of power; and wherein the mode control system is further operable to optimize the one or more pump coupling conditions by varying the polarization angle imposed by the variable polarizer with respect to a fiber axis of the photonic crystal fiber, thereby optimizing the pump polarization conditions of the radiation emitted from the broadband radiation source.

13. The mode control system as defined in clause 12, wherein the variable polarization arrangement comprises:
a variable polarizer operable to vary the polarization angle of the pump laser beam with respect to the photonic crystal fiber, and/or
an actuator operable to vary the angle of the photonic crystal fiber around its optical axis.

14. The mode control system as defined in any of clauses 1 to 13, wherein the detection unit comprises a beam shape and/or size measuring device operable to measure one or more beam characteristics of the output radiation related to the shape and/or size of the beam, the measurement data comprising and/or being derived from the beam characteristics of the output radiation related to the shape and/or size of the beam.

15. The mode control system as defined in clause 14, wherein the beam characteristics of the output radiation related to the shape and/or size of the beam comprise one or more selected from: beam ellipticity, beam diameter, Laguerre-Gaussian mode shape, or Zernike polynomial shape.

16. The mode control system as defined in any of clauses 1 to 15, configured such that the one or more parameters of radiation emitted from the broadband radiation source measured by the detection unit comprises leakage radiation emitted from the fiber cladding of the photonic crystal fiber.

17. The mode control system as defined in any of clauses 1 to 16, comprising one or more actuators to actuate movement of one or more components of the broadband radiation source; wherein the control signal is operable to control one or more of the actuators.

18. The mode control system as defined in clause 17, further comprising a control unit configured to receive the control signal from the processing unit and to control the one or more actuators.

19. The mode control system as defined in clause 17 or clause 18, wherein the one or more actuators are operable to optimization of one or more pump coupling conditions by optimizing one or more selected from:
angular offset of the pump laser beam with respect to the fiber core of the photonic crystal fiber;
lateral offset of the pump laser beam with respect to the fiber core of the photonic crystal fiber;
beam diameter of the pump laser beam
absolute polarization angle; and/or
divergence of the pump laser beam.

20. The mode control system as defined in any of clauses 17 to 19, wherein the one or more actuators comprise one or more selected from:
at least one actuator for at least one beam steering component or a support thereof;
at least one actuator for a gas cell of the photonic crystal fiber or a support thereof; and/or
at least one actuator for a focusing lens for focusing a pump laser beam onto a fiber core of the photonic crystal fiber.

21. The mode control system as defined in any of clauses 1 to 20, wherein the processing unit is operable to evaluate measurement data by comparing each of the one or more parameters of radiation emitted from the broadband radiation source to an equivalent threshold parameter value indicative of optimal or acceptable mode purity.

22. The mode control system as defined in any of clauses 1 to 21, wherein the photonic crystal fiber comprises a hollow-core photonic crystal fiber (HC-PCF).

23. The mode control system as defined in any of clauses 1 to 22, wherein the output radiation of the broadband radiation source comprises a wavelength range of 200 nm to 2000 nm, or a sub-range within this range.

24. The mode control system as defined in any of clauses 1 to 23, wherein mode purity describes a ratio between the power in the fundamental transverse mode and the total output power.

25. The mode control system as defined in any of clauses 1 to 24, wherein the mode control system being configured to generate a control signal for optimization of one or more pump coupling conditions of the broadband radiation source comprises: being configured to generate a control signal for optimization of the one or more pump coupling conditions, so as to maximize mode purity.

26. The mode control system as defined in any of clauses 1 to 25, comprising at least one detector for detecting leakage radiation and being operable in an initial coarse pump coupling operation to coarsely couple the pump laser beam with respect to the fiber core of the photonic crystal fiber, the coarse pump coupling operation comprising:
   measuring leakage radiation emitted from the fiber cladding of the photonic crystal fiber during a scanning of the pump laser beam on an input facet of the photonic crystal fiber; and
   determining whether the pump laser beam is coarsely aligned with the photonic crystal fiber based on the measured leakage radiation.

27. The mode control system as defined in clause 26, wherein determining whether the pump laser beam is coarsely aligned comprises locating a minimum value in the measured leakage radiation between at least two maximum values in the measured leakage radiation.

28. The mode control system as defined in clause 26 or clause 27, wherein determining whether the pump laser beam is coarsely aligned comprises locating a minimum value in the measured leakage radiation inside of a surrounding annular region of maximum values in the measured leakage radiation.

29. The mode control system as defined in any of clauses 26 to 28, wherein the at least one detector comprises a plurality of detectors spaced radially around the fiber cladding.

30. The mode control system as defined in clause 29, wherein each detector extends in a radial direction of the photonic crystal fiber about a longitudinal axis of the photonic crystal fiber over an angle smaller than 360/n degrees, where n is the amount of detectors 31. The mode control system as defined in any of clauses 26 to 28, wherein the at least one detector comprises at least one pair of a detector and mirror, each detector and mirror located at radially opposed locations around the fiber cladding.

32. The mode control system as defined in any of clauses 26 to 31, wherein the scanning of the pump laser beam comprises a scan along a spiral path on the input facet.

33. The mode control system as defined in any of clauses 1 to 32, further comprising an optical manipulation unit for scanning the radiation beam, the optical manipulation unit comprising:
   one or more optical elements configured to manipulate the radiation beam;
   a radiation beam tilt adjuster to adjust a propagation direction of the radiation beam; and
   a control unit to control the radiation beam tilt adjuster in order to set the propagation direction towards the photonic crystal fiber.

34. The mode control system as defined in clause 35 wherein the radiation beam tilt adjuster comprises at least two wedge prisms arranged in series and a tilt actuation system, and wherein the tilt actuation system is controllable by the control unit to independently rotate the wedge prisms about their respective optical axis.

35. The mode control system as defined in clause 33 or clause 34, wherein the optical manipulation unit further comprises a radiation beam displacement device to displace the radiation beam, wherein the radiation beam displacement device comprises a plane-parallel plate and a displacement actuation system controllable by the control unit to rotate the plane-parallel plate about a first axis substantially perpendicular to the propagation direction of the radiation beam, wherein desirably the displacement actuation system is further controllable to rotate the plane-parallel plate about a second axis substantially perpendicular to the propagation direction of the radiation beam and the first axis, and wherein desirably the radiation beam displacement device comprises a second plane-parallel plate and the displacement actuation system is controllable by the control unit to rotate the second plane-parallel plate about a second axis substantially perpendicular to the propagation direction of the radiation beam and the first axis.

36. A timing control system, being configured for determining timing of a broadband radiation source comprising a photonic crystal fiber (PCF), the timing control system comprising at least one pressure sensor configured to detect pressure change in a gas environment surrounding the photonic crystal fiber, and output at least one electrical signal in dependence of the pressure change, wherein the at least one electrical signal is used to determine timing of at least one pulse of the broadband radiation source.

37. The timing control system as defined in clause 36, wherein the at least one pulse of the broadband radiation source comprises a broadband pulse generated within the photonic crystal fiber and causing the pressure change.

38. The timing control system as defined in clause 36, wherein the at least one pulse of the broadband radiation source comprises a pump pulse configured to couple into the photonic crystal fiber and cause the pressure change.

39. The timing control system as defined in any of clauses 36 to 38, wherein the photonic crystal fiber comprises a hollow-core photonic crystal fiber (HC-PCF).

40. The timing control system as defined in any of clauses 36 to 39, wherein the at least one electrical signal is configured as a trigger signal for at least one selected from: the pump pulse or the broadband pulse.

41. A broadband radiation source device comprising:
   the mode control system as defined in any of clauses 1 to 35; and/or
   the timing control system as defined in any of clauses 36 to 40.

42. A metrology device comprising the broadband radiation source device as defined in clause 41.

43. The metrology device as defined in clause 42, comprising a scatterometer metrology apparatus, a level sensor or an alignment sensor.

44. A method of mode control of a broadband radiation source comprising a photonic crystal fiber, the method comprising:
   measuring one or more parameters of radiation emitted from the broadband radiation source to obtain measurement data;
   evaluating mode purity of the radiation emitted from the broadband radiation source, from the measurement data; and
   generating a control signal to optimize of one or more pump coupling conditions of the broadband radiation source, the one or more pump coupling conditions relating to the coupling of a pump laser beam with respect to a fiber core of the photonic crystal fiber.

45. The method as defined in clause 44, wherein the one or more parameters of the output radiation comprises one or more parameters indicative of mode purity of the broadband radiation source.

46. The method as defined in clause 44 or clause 45, wherein the radiation emitted from the broadband radiation source detected by the detection unit comprises output radiation emitted from an output end of the photonic crystal fiber.

47. The method as defined in clause 46, comprising splitting a reference beam from a main output beam emitted by the photonic crystal fiber, the measuring one or more parameters from the reference beam.

48. The method as defined in any of clauses 44 to 47, wherein the measuring step comprises measuring one or more spectral parameter values of the output radiation to obtain the measurement data.

49. The method as defined in clause 48, wherein the one or more spectral parameter values comprise a power spectral density value in one or more spectral ranges.

50. The method as defined in clause 48 or clause 49, comprising bandpass filtering the radiation emitted from the broadband radiation source and measuring an illumination parameter indicative of the power of the filtered radiation.

51. The method as defined in any of clauses 44 to 50, comprising spatially filtering out higher order modes other than a fundamental mode from the radiation emitted from the broadband radiation source and measuring an illumination parameter indicative of the power of the filtered radiation.

52. The method as defined in any of clauses 44 to 51, wherein the measuring step comprises measuring one or more beam characteristics of the output radiation related to the shape and/or size of the beam to obtain the measurement data.

53. The method as defined in clause 52, wherein the one or more beam characteristics of the output radiation related to the shape and/or size of the beam comprise one or more selected from: beam ellipticity, beam diameter, Laguerre-Gaussian mode shape, or Zernike polynomial shape.

54. The method as defined in any of clauses 44 to 53, wherein the measuring step comprises measuring leakage radiation emitted from the fiber cladding of the photonic crystal fiber to obtain the measurement data.

55. The method as defined in any of clauses 44 to 54, comprising actuating movement of one or more components of the broadband radiation source based on the control signal so as to optimize of one or more pump coupling conditions of the broadband radiation source.

56. The method as defined in clause 55, wherein the one or more actuators are operable to optimize one or more pump coupling conditions by optimizing one or more selected from:
    angular offset of the pump laser beam with respect to the fiber core of the photonic crystal fiber;
    lateral offset of the pump laser beam with respect to the fiber core of the photonic crystal fiber;
    beam diameter of the pump laser beam;
    absolute polarization angle; and/or
    divergence of the pump laser beam.

57. The method as defined in clause 55 or clause 56, wherein the one or more actuators comprise one or more selected from:
    at least one actuator for at least one beam steering component or a support thereof;
    at least one actuator for a gas cell of the photonic crystal fiber or a support thereof; and/or
    at least one actuator for a focusing lens for focusing a pump laser beam onto a fiber core of the photonic crystal fiber.

58. The method as defined in any of clauses 44 to 57, wherein the evaluation step comprises comparing each of the one or more parameters of radiation emitted from the broadband radiation source to an equivalent threshold parameter value indicative of optimal or acceptable mode purity.

59. The method as defined in any of clauses 44 to 58, wherein the photonic crystal fiber comprises a hollow-core photonic crystal fiber (HC-PCF).

60. The method as defined in any of clauses 44 to 59, wherein mode purity describes a ratio between the power in the fundamental transverse mode and the total output power.

61. The method as defined in any of clauses 44 to 60, wherein the generating a control signal for optimization of one or more pump coupling conditions, optimizes the one or more pump coupling conditions to maximize mode purity.

62. The method as defined in any of clauses 44 to 61, comprising:
    an initial coarse pump coupling step to coarsely couple the pump laser beam with respect to the fiber core of the photonic crystal fiber, the coarse pump coupling step comprising measuring leakage radiation emitted from the fiber cladding of the photonic crystal fiber during a scanning of the pump laser beam on an input facet of the photonic crystal fiber; and
    determining whether the pump laser beam is coarsely aligned with the photonic crystal fiber based on the measured leakage radiation.

63. The method as defined in clause 62, wherein determining whether the pump laser beam is coarsely aligned comprises locating a minimum value in the measured leakage radiation between at least two maximum values in the measured leakage radiation.

64. The method as defined in clause 62 or clause 63, wherein determining whether the pump laser beam is coarsely aligned comprises locating a minimum value in the measured leakage radiation inside of a surrounding annular region of maximum values in the measured leakage radiation.

65. The method as defined in any of clauses 62 to 64, wherein the scanning of the pump laser beam the radiation beam comprises a scan along a spiral path on the input facet.

66. A method of performing a coarse pump coupling step to coarsely couple a pump laser beam with respect to a fiber core of a photonic crystal fiber, the coarse pump coupling step comprising:
    measuring leakage radiation emitted from a fiber cladding of the photonic crystal fiber during a scanning of the pump laser beam on an input facet of the photonic crystal fiber; and
    determining whether the pump laser beam is coarsely aligned with the photonic crystal fiber based on the measured leakage radiation.

67. The method as defined in clause 66, wherein determining whether the pump laser beam is coarsely aligned comprises locating a minimum value in the measured leakage radiation between at least two maximum values in the measured leakage radiation.

68. The method as defined in clause 66 or clause 67, wherein determining whether the pump laser beam is coarsely aligned comprises locating a minimum value in the measured leakage radiation inside of a surrounding annular region of maximum values in the measured leakage radiation.

69. The method as defined in any of clauses 66 to 68, wherein the scanning of the pump laser beam the radiation beam comprises a scan along a spiral path on the input facet.

70. A method for determining an optimized value for a polarization parameter describing an angle of polarization of radiation with respect to an optical plane of a waveguide, the method comprising:
    obtaining a relationship between the angle of polarization and a power parameter indicative of power of radiation having traversed the waveguide;

obtaining a value for the power parameter, and determining the optimized value for a polarization parameter from the value for the power parameter and the relationship.

71. The method as defined in clause 70, wherein the waveguide comprises a photonic crystal fiber or hollow-core photonic crystal fiber.

72. The method as defined in clause 70 or clause 71, wherein the determining step comprises determining the optimized value as that corresponding to a minima for the power parameter.

73. The method as defined in any of clauses 70 to 72, comprising:

varying a polarization of the radiation between a plurality of angular positions;

obtaining a plurality of values for the power parameter, each value corresponding to one of the angular positions; and selecting an optimized value for the polarization parameter as that corresponding to at least one minimum value out of the plurality of values for the power parameter.

74. The method as defined in clause 73, wherein the varying the polarization of the radiation comprises rotating any one or more selected from: a polarizer device, a radiation source emitting the radiation, or the nominally cylindrically shaped waveguide.

75. A polarization control system, being configured for controlling the output polarization of a broadband radiation source comprising a waveguide, the polarization control system comprising:

at least one detection unit configured to measure one or more parameters of radiation emitted from the broadband radiation source to generate measurement data; and a processing unit configured to infer a polarization property of the radiation emitted from the broadband radiation source from the measurement data, wherein, based on the evaluation, the polarization control system is configured to generate a control signal for optimization of one or more pump polarization conditions of the broadband radiation source, the one or more pump polarization conditions relating to the coupling of a pump laser beam with respect to a fiber axis of the photonic crystal fiber.

76. The polarization control system as defined in clause 75, wherein the waveguide comprises a photonic crystal fiber or hollow-core photonic crystal fiber.

77. The polarization control system as defined in clause 75 or clause 76 comprising a variable polarizer device for varying the pump polarization conditions of the broadband radiation source with respect to the fiber axis of the photonic crystal fiber.

78. The polarization control system as defined in any of clauses 75 to 77, wherein the polarizer device comprises a rotatable half-wave plate.

79. The polarization control system as defined in any of clauses 75 to 78, wherein the detection unit comprises a power measuring device and the one or more parameters of radiation comprises power.

80. The polarization control system as defined in any of clauses 75 or 79, comprising an optical filter to select one or more desired wavelengths prior to the detection unit.

81. The polarization control system as defined in any of clauses 75 to 80, comprising a measurement branch for collecting a portion of the radiation emitted from the broadband radiation source.

82. An assembly comprising:

an optical element for receiving and modifying radiation;

a receiving element for receiving the modified radiation;

a gas environment for enclosing the receiving element; and a controlling element configured to stabilize a matching condition between the optical element and the receiving element by adjusting either the modifying of the received radiation or adjusting a distance between the optical element and the receiving element in dependency to a property of the gas environment.

83. The assembly of clause 82, wherein the radiation is substantially monochromatic, the optical element is a focusing element configured to provide focused monochromatic radiation to the element and wherein the element is a non-linear element configured for converting the focused and monochromatic radiation into broadband radiation.

84. The assembly of clause 83, wherein the non-linear element is a non-linear fiber embedded in the gas environment.

85. The assembly of clause 84, wherein the property of the gas environment is a temperature, pressure or composition of the gas.

86. The assembly of clause 85, wherein the controlling element comprises an actuator configured to variably position the focusing element relative to the non-linear fiber along an optical axis of the non-linear fiber.

87. The assembly of clause 85, wherein the controlling element comprises an actuator configured to variably adjust the optical power of the focusing element.

88. The assembly of any of clauses 84 to 87, wherein the matching condition is associated with the efficiency of coupling the focused monochromatic radiation into the non-linear fiber.

89. The assembly of any of clauses 85 to 87, wherein the controlling element further comprises a processor configured to receive measurement values associated with the temperature, pressure or composition of the gas.

90. The assembly of clause 89, wherein the processor is configured to determine a change in refractive index of the gas.

91. The assembly of clause 90, wherein the processor is further configured to determine a focal position variation based on knowledge of optical elements positioned in the radiation path upstream of the non-linear fiber.

92. The assembly of any of clauses 89 to 91, further comprising a sensor configured to measure the property of the gas environment.

93. An assembly comprising:

an optical element for receiving and modifying radiation;

a receiving element for receiving the modified radiation; and a controlling element configured to stabilize a matching condition between the optical element and the receiving element by adjusting either the modifying of the received radiation or adjusting a distance between the optical element and the receiving element in dependency to a property of a gas environment enclosing the receiving element.

94. An assembly comprising:

an optical element for receiving and modifying radiation;

a receiving element for receiving the modified radiation; and a controlling element configured to stabilize a matching condition between the optical element and the receiving element by adjusting either the modifying of the received radiation or adjusting a distance between the optical element and the receiving element based on an optical power determined at an exit of the receiving element.

95. The assembly of clause 94, wherein the adjusting is further based on an optical power determined at an entrance of the receiving element.

96. The assembly of clause 95, wherein the adjusting is based on a ratio between i) the optical power determined at the exit of the receiving element and ii) the optical power determined at an entrance of the receiving element.

Although all the above-mentioned examples and embodiments are in connection with HC-PCF based broadband radiation sources, an embodiment is equally suitable for mode control of a SC-PCF based broadband radiation source. In a different embodiment, the detection unit of a mode control system measures one or more parameters of the broadband output beam of a SC-PCF based broadband radiation source. Such one or more parameters should be capable of indicating performance of output mode of the SC-PCF based broadband radiation source. The measured data is processed in a processing unit and the processed data is subsequently evaluated. Depending on the outcome of the evaluation, a feedback signal (or a control signal) is generated and sent to the control unit of the mode control system. Finally, the control unit receives the control signal and controls one or more active components of the SC-PCF based broadband radiation source such that one or more pump coupling conditions of the radiation source are improved and the output mode purity of the SC-PCF based radiation source is improved or optimized.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of performing a pump coupling to couple a pump laser beam with respect to a fiber core of a photonic crystal fiber, the method comprising:
    measuring leakage radiation emitted from a location on an outer surface of a fiber cladding of the photonic crystal fiber during a scanning of the pump laser beam on an input facet of the photonic crystal fiber, the measuring using a detector with a radiation-receiving detection surface facing toward the location on the outer surface of the fiber cladding and spaced apart from the cladding; and
    determining whether the pump laser beam is aligned with the photonic crystal fiber based on the measured leakage radiation.

2. The method of claim 1, wherein the determining whether the pump laser beam is aligned comprises locating a minimum value in the measured leakage radiation between at least two maximum values in the measured leakage radiation.

3. The method of claim 1, wherein the determining whether the pump laser beam is aligned comprises locating a minimum value in the measured leakage radiation inside of a surrounding annular region of maximum values in the measured leakage radiation.

4. The method of claim 1, wherein the scanning of the pump laser beam comprises a scan along a spiral path on the input facet.

5. The method of claim 1, wherein the determining is a coarse alignment and further comprising performing a fine alignment using the pump laser beam at a power level higher than as used in the coarse alignment.

6. The method of claim 1, wherein the measuring uses a plurality of detectors spaced around the fiber cladding.

7. The method of claim 6, wherein each detector of the plurality of detectors extends in a radial direction of the photonic crystal fiber about a longitudinal axis of the photonic crystal fiber over an angle smaller than 360/n degrees, where n is the amount of detectors.

8. The method of claim 1, wherein the measuring uses at least one pair of a detector and mirror, the detector and mirror of the pair located at radially opposed locations around the fiber cladding.

9. A system for performing a pump coupling step to couple a pump laser beam with respect to a fiber core of a photonic crystal fiber, the system comprising:
    a detector configured to measure leakage radiation emitted from a location on an outer surface of a fiber cladding of the photonic crystal fiber during a scanning of the pump laser beam on an input facet of the photonic crystal fiber, wherein the detector has a radiation-receiving detection surface facing toward the location on the outer surface of the fiber cladding and spaced apart from the cladding; and
    instructions, when executed by a processor or controller, configured to determine whether the pump laser beam is aligned with the photonic crystal fiber based on the measured leakage radiation.

10. The system of claim 9, wherein the instructions configured determine whether the pump laser beam is aligned are further configured to locate a minimum value in the measured leakage radiation between at least two maximum values in the measured leakage radiation.

11. The system of claim 9, wherein the instructions configured determine whether the pump laser beam is aligned are further configured to locate a minimum value in the measured leakage radiation inside of a surrounding annular region of maximum values in the measured leakage radiation.

12. The system of claim 9, wherein the scanning of the pump laser beam comprises a scan along a spiral path on the input facet.

13. The system of claim 9, wherein the detector comprises a plurality of detectors spaced around the fiber cladding and wherein each detector of the plurality of detectors extends in a radial direction of the photonic crystal fiber about a longitudinal axis of the photonic crystal fiber over an angle smaller than 360/n degrees, where n is the amount of detectors.

14. The system of claim 9, wherein the detector comprises at least one pair of a detector and mirror, the detector and mirror of the pair located at radially opposed locations around the fiber cladding.

15. The system of claim 9, wherein the determination of whether the pump laser beam is aligned is a coarse alignment and the instructions are further configured to cause performance of a fine alignment using the pump laser beam at a power level higher than as used in the coarse alignment.

16. A broadband radiation source device comprising:
a source of radiation; and
the system of claim 9.

17. A metrology device comprising:
the broadband radiation source device of claim 16; and
a further detector.

18. A mode control system comprising:
a detector configured to measure leakage radiation emitted from a fiber cladding of a photonic crystal fiber during a scanning of a pump laser beam on an input facet of the photonic crystal fiber; and
instructions, when executed by a processor or controller, configured to evaluate mode purity of the radiation emitted from a broadband radiation source comprising the photonic crystal fiber, from the measured leakage radiation,
wherein, based on the evaluation, the mode control system is configured to generate a control signal for optimization of one or more pump coupling conditions of the broadband radiation source, the one or more pump coupling conditions relating to the coupling of the pump laser beam with respect to a fiber core of the photonic crystal fiber.

19. A broadband radiation source device comprising:
a source of radiation; and
the system of claim 18.

20. A metrology device comprising:
the broadband radiation source device of claim 19; and
a further detector.

* * * * *